United States Patent
Kim et al.

(10) Patent No.: US 10,887,994 B2
(45) Date of Patent: Jan. 5, 2021

(54) ANTENNA SUBSTRATE AND ANTENNA MODULE INCLUDING THE SAME

(71) Applicant: Samsung Electro-Mechanics Co., Ltd., Suwon-si, Gyeonggi-do (KR)

(72) Inventors: Doo Il Kim, Suwon-si (KR); Young Sik Hur, Suwon-si (KR); Won Wook So, Suwon-si (KR); Yong Ho Baek, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 0 days.

(21) Appl. No.: 16/260,739

(22) Filed: Jan. 29, 2019

(65) Prior Publication Data
US 2020/0015357 A1    Jan. 9, 2020

(30) Foreign Application Priority Data

Jul. 9, 2018    (KR) .................. 10-2018-0079328

(51) Int. Cl.
*H05K 1/18*    (2006.01)
*H05K 1/14*    (2006.01)
(Continued)

(52) U.S. Cl.
CPC .............. *H05K 1/181* (2013.01); *H01L 23/13* (2013.01); *H01L 23/3128* (2013.01);
(Continued)

(58) Field of Classification Search
CPC ........ H05K 1/181; H05K 1/028; H05K 1/144; H01Q 1/22; H01Q 9/0407
See application file for complete search history.

(56) References Cited

U.S. PATENT DOCUMENTS 8,851,390 B2    10/2014 Ikemoto
9,991,599 B2*   6/2018 Kanno .................. H01Q 1/243
(Continued)

FOREIGN PATENT DOCUMENTS

CN    102074800 A    4/2011
CN    103026551 A    4/2013
(Continued)

OTHER PUBLICATIONS

Office Action issued in corresponding Korean Application No. 10-2018-0079328, dated Apr. 29, 2019.
(Continued)

*Primary Examiner* — Binh B Tran
*Assistant Examiner* — Hiram E Gonzalez
(74) *Attorney, Agent, or Firm* — Morgan, Lewis & Bockius LLP

(57) ABSTRACT

An antenna substrate includes: a first substrate including an antenna pattern disposed on an upper surface of the first substrate; a second substrate having a first planar surface, an area of which is smaller than an area of a planar surface of the first substrate; and a flexible substrate connecting the first and second substrates to each other and bent to allow the first planar surface of the second substrate to face a side surface of the first substrate, which is perpendicular to the upper surface of the first substrate.

19 Claims, 19 Drawing Sheets

(51) Int. Cl.
*H01Q 21/08* (2006.01)
*H01Q 9/04* (2006.01)
*H01Q 1/22* (2006.01)
*H01L 23/538* (2006.01)
*H01L 23/66* (2006.01)
*H01L 25/16* (2006.01)
*H01L 23/31* (2006.01)
*H01L 23/552* (2006.01)
*H01L 23/13* (2006.01)
*H01L 23/00* (2006.01)
*H05K 1/02* (2006.01)

(52) U.S. Cl.
CPC ...... *H01L 23/5385* (2013.01); *H01L 23/5386* (2013.01); *H01L 23/5387* (2013.01); *H01L 23/5389* (2013.01); *H01L 23/552* (2013.01); *H01L 23/66* (2013.01); *H01L 24/24* (2013.01); *H01L 25/165* (2013.01); *H01Q 1/22* (2013.01); *H01Q 9/0407* (2013.01); *H01Q 21/08* (2013.01); *H05K 1/028* (2013.01); *H05K 1/144* (2013.01); *H01L 2223/6616* (2013.01); *H01L 2223/6677* (2013.01); *H01L 2224/24137* (2013.01); *H01L 2224/24195* (2013.01); *H01L 2924/19041* (2013.01); *H01L 2924/19042* (2013.01); *H01L 2924/19105* (2013.01); *H01L 2924/3025* (2013.01); *H05K 2201/042* (2013.01); *H05K 2201/1003* (2013.01); *H05K 2201/10015* (2013.01); *H05K 2201/10098* (2013.01); *H05K 2201/10378* (2013.01)

(56) References Cited

U.S. PATENT DOCUMENTS

| 2010/0190528 | A1* | 7/2010 | Hsiao ............... G06K 19/041 455/558 |
| 2013/0112754 | A1* | 5/2013 | Ikemoto ............ G06K 7/10336 235/488 |
| 2015/0011615 | A1 | 4/2015 | Chen et al. |
| 2015/0116156 | A1 | 4/2015 | Chen et al. |
| 2018/0145033 | A1 | 5/2018 | Yi et al. |
| 2019/0103653 | A1* | 4/2019 | Jeong ............... H01L 23/28 |

FOREIGN PATENT DOCUMENTS

| CN | 203277640 | U | 11/2013 |
| CN | 107978593 | A | 5/2018 |
| JP | 2001-094031 | A | 4/2001 |
| JP | 4626289 | B2 | 11/2010 |
| JP | 5545371 | B2 | 5/2014 |
| KR | 10-2018-0058095 | A | 5/2018 |

OTHER PUBLICATIONS

Office Action issued in Taiwanese Patent Application No. 108103656, dated Mar. 13, 2020 (with English Translation).
The First Office Action issued in CN Application No. 201910276164.X dated Aug. 5, 2020 (English translation).

* cited by examiner

I - I'

II - II'

III-III'

ANTENNA SUBSTRATE AND ANTENNA MODULE INCLUDING THE SAME

CROSS-REFERENCE TO RELATED APPLICATION(S)

This application claims the benefit of priority to Korean Patent Application No. 10-2018-0079328 filed on Jul. 9, 2018 in the Korean Intellectual Property Office, the disclosure of which is incorporated herein by reference in its entirety.

TECHNICAL FIELD

The present disclosure relates to an antenna substrate and an antenna module including the same.

BACKGROUND

Recently, in accordance with the trend for thinness of electronic devices, thicknesses of various components in a mobile device, such as a smartphone, are significantly limited. Therefore, when a millimeter wave/5G antenna module is used in a mobile device, inevitably there are many limitations in a size, a thickness, and the like, of the millimeter wave/5G antenna module in order to secure a degree of freedom of a mounting position of the millimeter wave/5G antenna module within a set.

SUMMARY

An aspect of the present disclosure may provide an antenna substrate capable of allowing a degree of freedom to be secured when an antenna module is mounted in a set by allowing an overall thickness of the antenna module to be reduced in a case in which the antenna substrate is used in the antenna module, and an antenna module including the same.

According to an aspect of the present disclosure, an antenna module may be provided, in which a rigid portion having a smaller area is bent toward a side portion of a rigid portion having a larger area using a flexible portion in an antenna substrate having a rigid-flexible-rigid form.

According to an aspect of the present disclosure, an antenna substrate may include: a first substrate including an antenna pattern disposed on an upper surface of the first substrate; a second substrate having a first planar surface, an area of which is smaller than an area of a planar surface of the first substrate; and a flexible substrate connecting the first and second substrates to each other and bent to allow the first planar surface of the second substrate to face a side surface of the first substrate, which is perpendicular to the upper surface of the first substrate.

According to another aspect of the present disclosure, an antenna module may include: an antenna substrate including a first substrate including an antenna pattern disposed on an upper surface of the first substrate, a second substrate having a first planar surface, an area of which is smaller than an area of a planar surface of the first substrate, and a flexible substrate connecting the first and second substrates to each other and bent to allow the first planar surface of the second substrate to face a side surface of the first substrate, which is perpendicular to the upper surface of the first substrate; and an electronic component disposed on a second planar surface of the second substrate opposing the first planar surface of the second substrate.

The antenna module may further include: at least one semiconductor chip surface-mounted on a lower surface of the first substrate, perpendicular to the side surface of the first substrate and opposing the upper surface of the first substrate; at least one passive component surface-mounted on the lower surface of the first substrate; an encapsulant disposed on the lower surface of the first substrate and covering at least a part of the at least one semiconductor chip and the at least one passive component; and a metal layer covering an outer surface of the encapsulant.

Alternatively, the antenna module may further include: at least one semiconductor chip surface-mounted on a lower surface of the first substrate, perpendicular to the side surface of the first substrate and opposing the upper surface of the first substrate; at least one passive component surface-mounted on the lower surface of the first substrate; and a shield can disposed on the lower surface of the first substrate and surrounding the at least one semiconductor chip and the at least one passive component.

Alternatively, the antenna module may further include a semiconductor package disposed below the antenna substrate and including at least one semiconductor chip. In this case, the electronic component may have a thickness greater than that of the at least one semiconductor chip and/or the semiconductor package.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
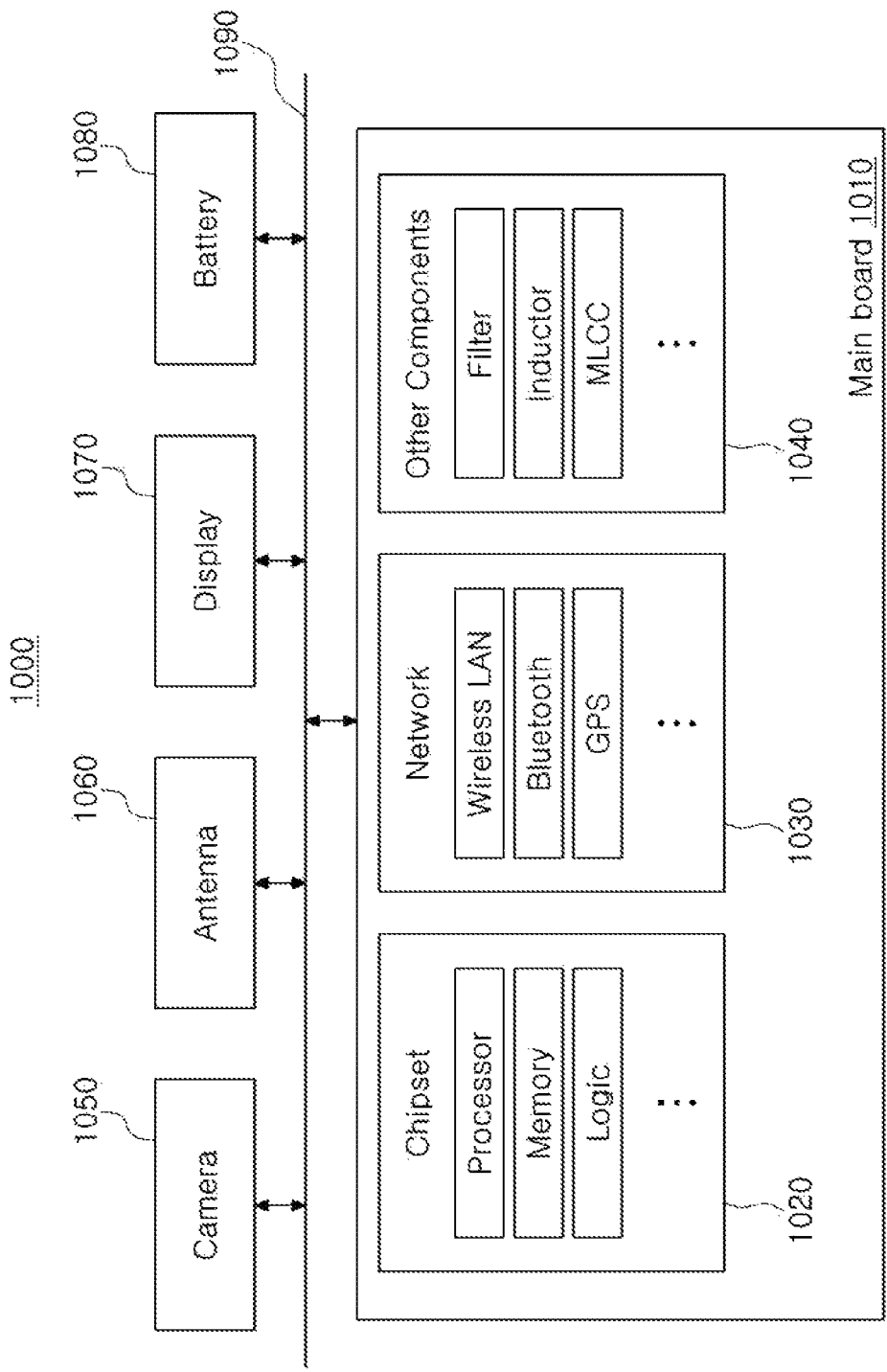
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
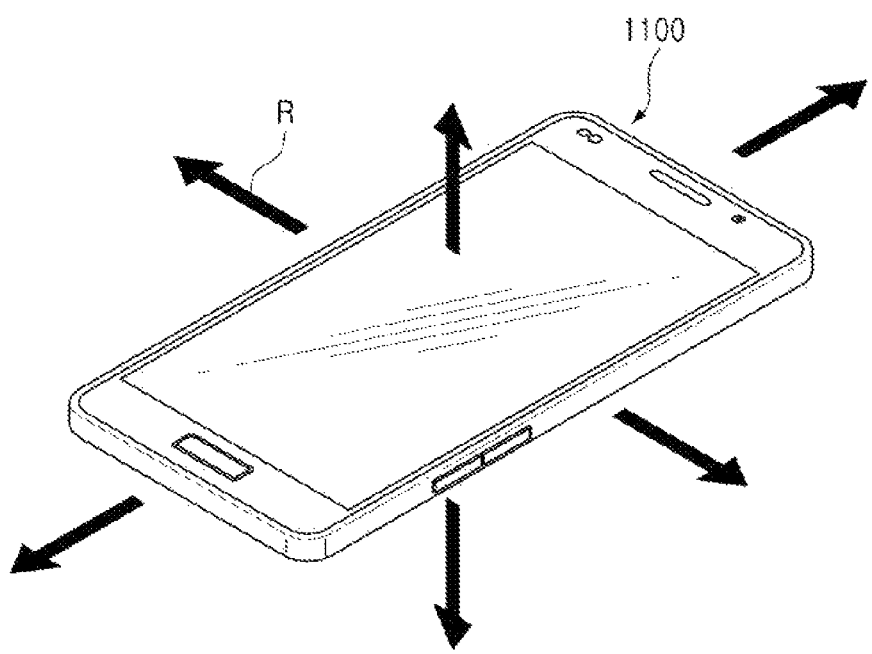
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. In the smartphone 1100, a radio frequency integrated circuit (RFIC) may be used in a semiconductor package form, and an antenna may be used in a substrate or module form. The RFIC and the antenna may be electrically connected to each other in the smartphone 1100, and radiation R of antenna signals in various directions may be thus possible. A semiconductor package including the RFIC and a substrate or a module including the antenna may be used in various forms in an electronic device such as the smartphone, or the like.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
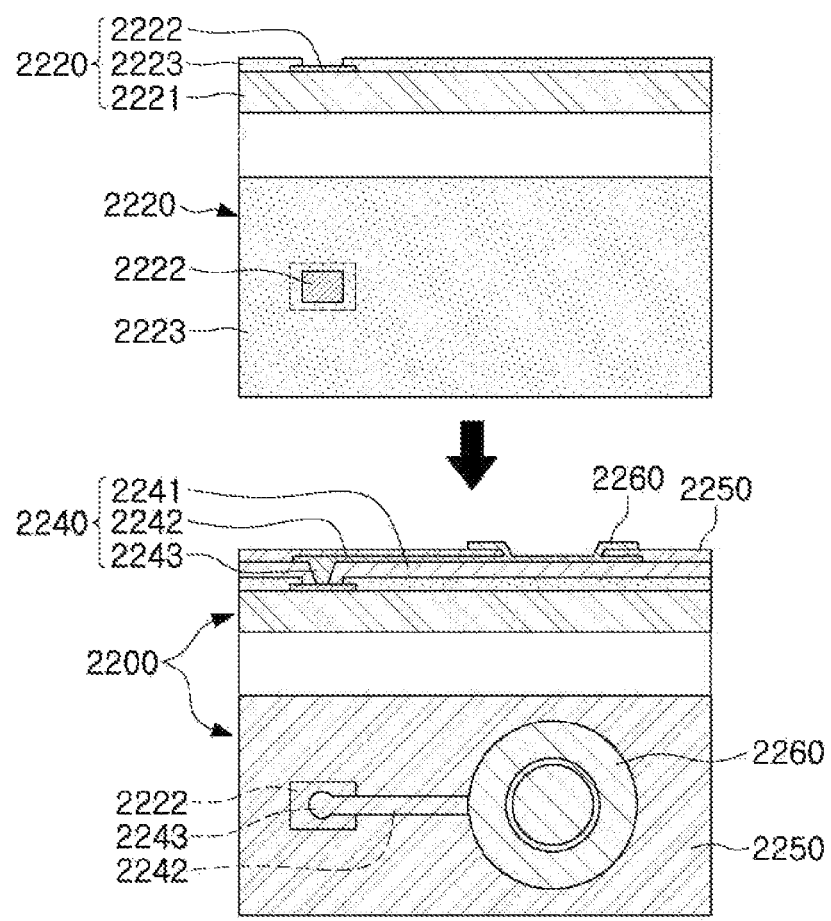
FIGS. 3A and 3B are schematic cross-sectional views illustrating states of a fan-in semiconductor package before and after being packaged.
Figure 3B:
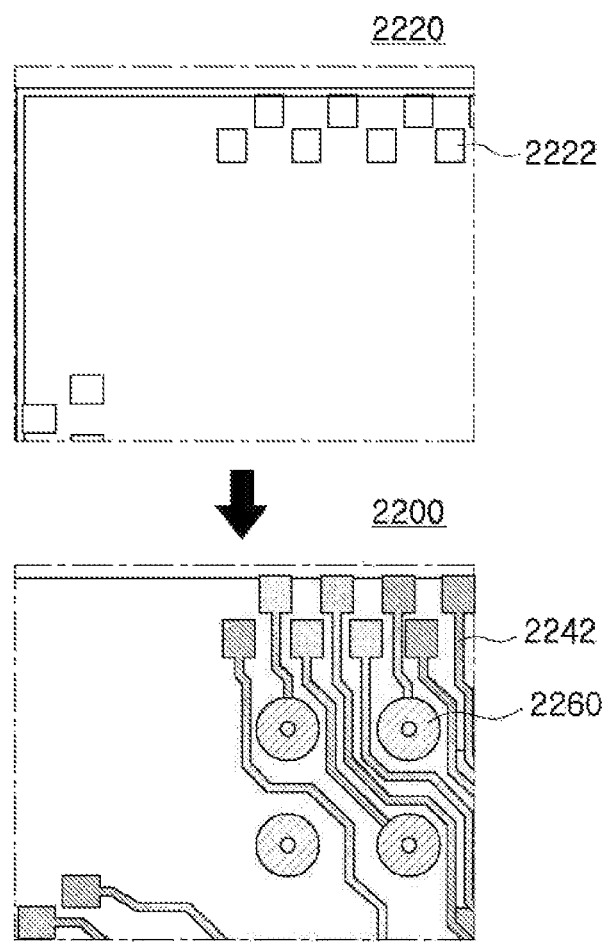

FIGS. 3A and 3B are schematic cross-sectional views illustrating states of a fan-in semiconductor package before and after being packaged.

Figure 4:
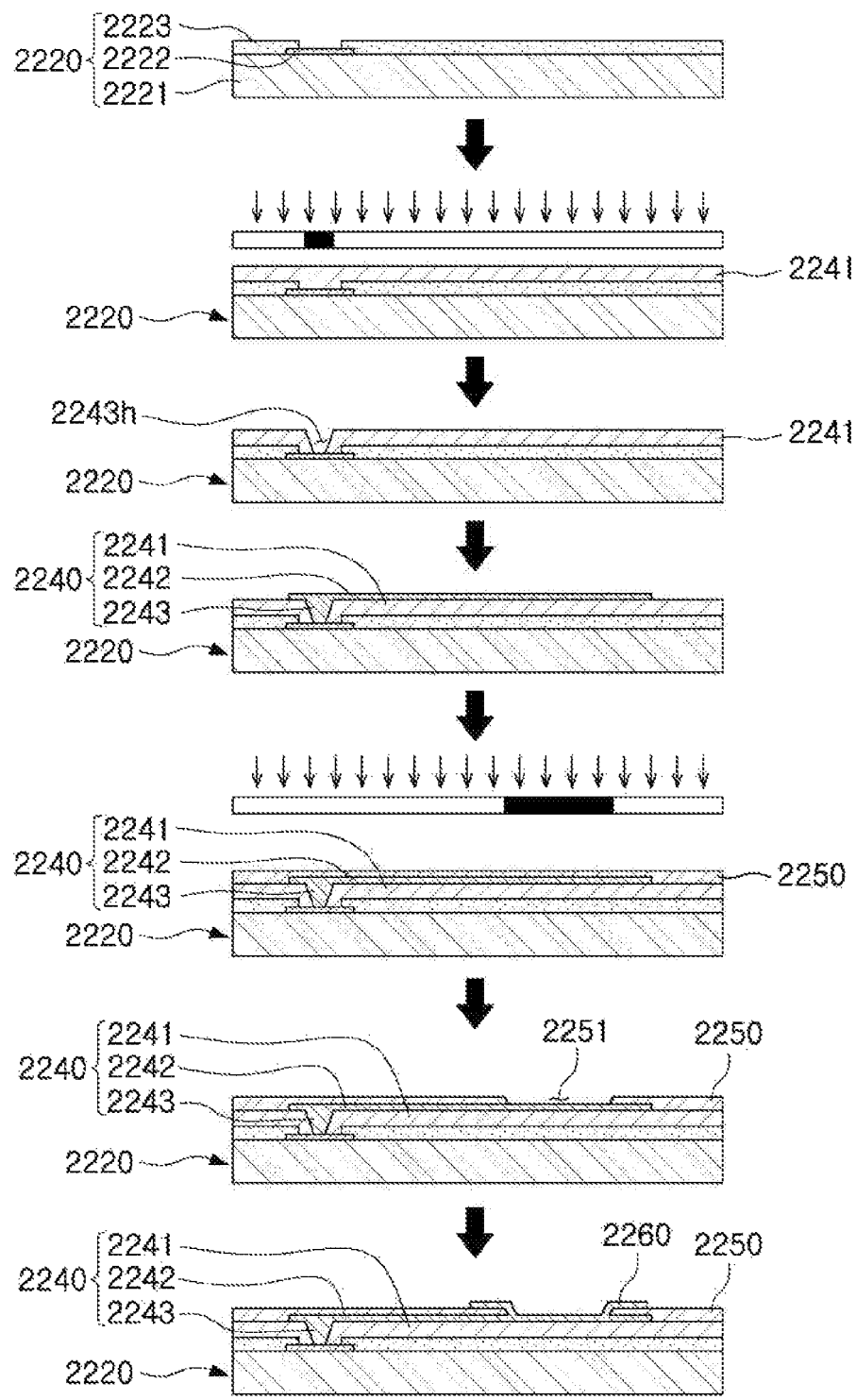
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a metal material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
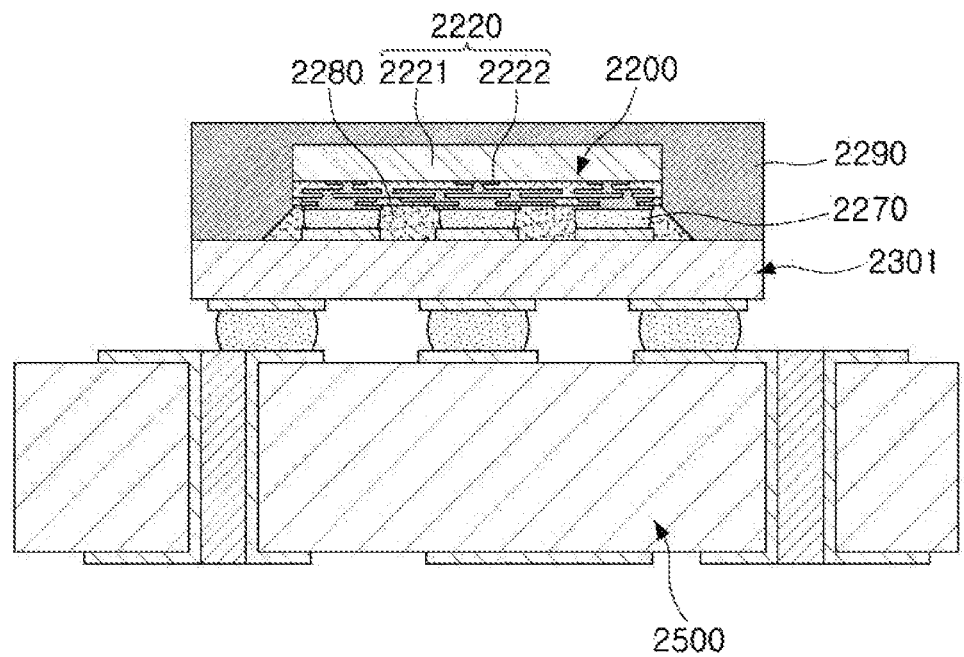
FIG. 5 is a schematic cross-sectional view illustrating a case in which a fan-in semiconductor package is mounted on a printed circuit substrate and is ultimately mounted on a mainboard of an electronic device.

FIG. 5 is a schematic cross-sectional view illustrating a case in which a fan-in semiconductor package is mounted on a printed circuit substrate and is ultimately mounted on a mainboard of an electronic device.

Figure 6:
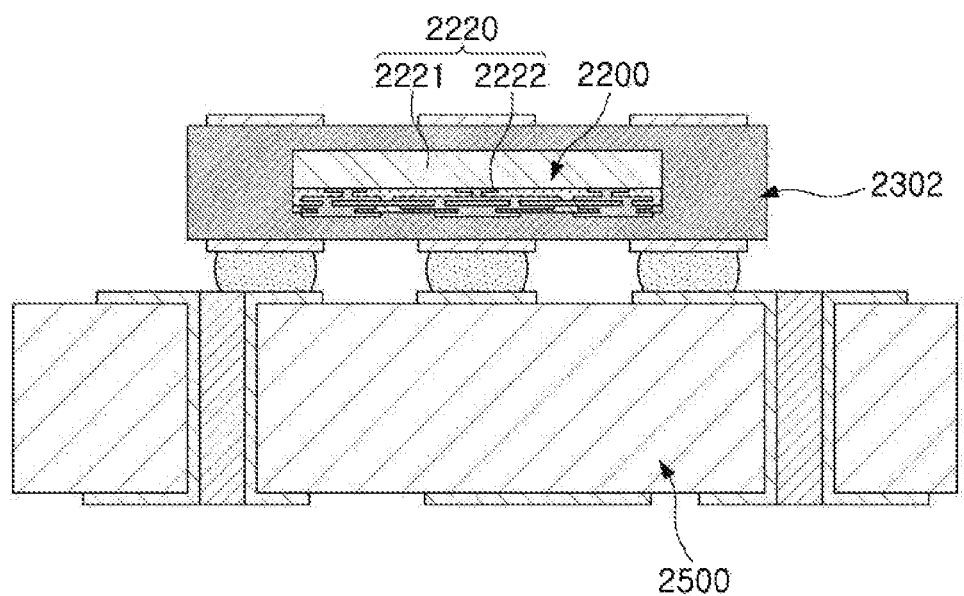
FIG. 6 is a schematic cross-sectional view illustrating a case in which a fan-in semiconductor package is embedded in a printed circuit board and is ultimately mounted on a main board of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
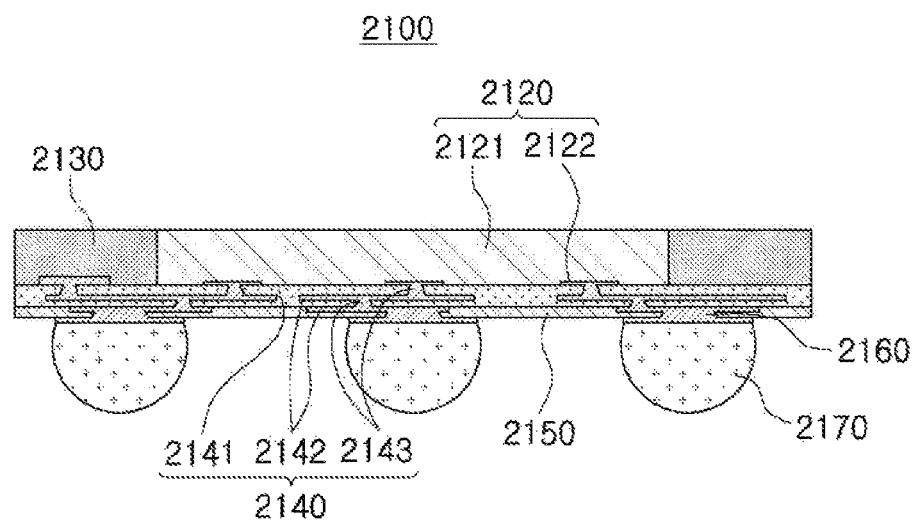
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2141, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
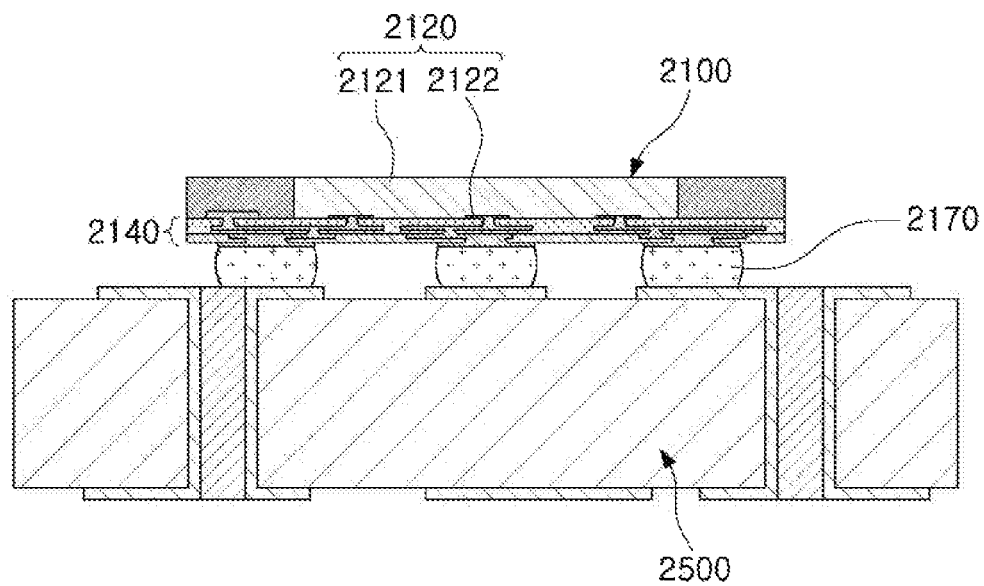
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Antenna Module

Figure 9:
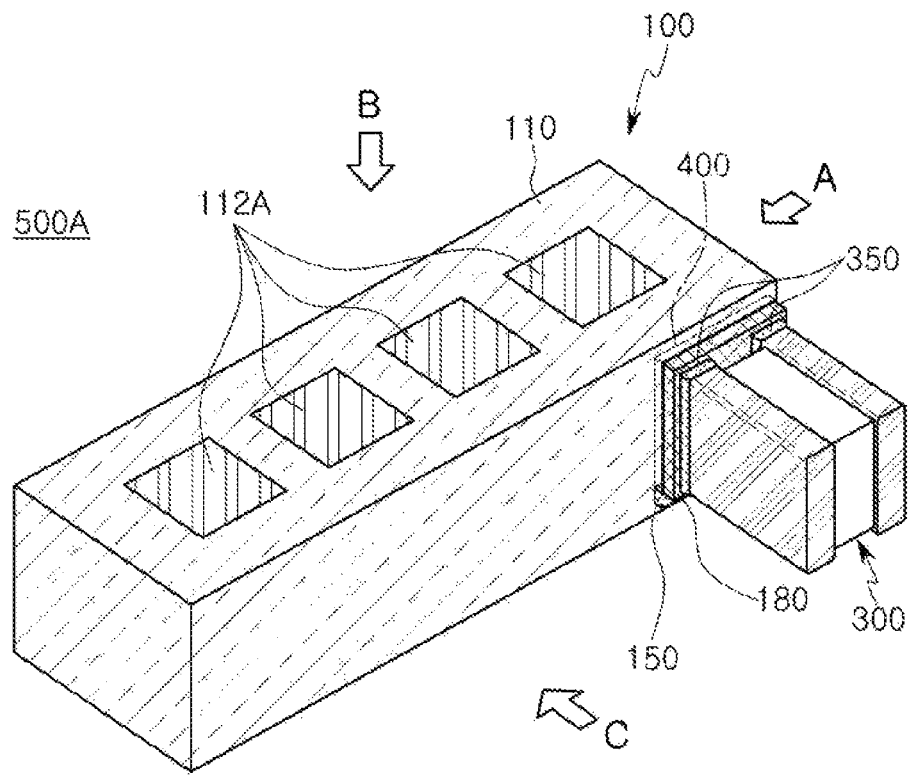
FIG. 9 is a schematic perspective view illustrating an antenna module according to an exemplary embodiment in the present disclosure.

FIG. 9 is a schematic perspective view illustrating an antenna module according to an exemplary embodiment in the present disclosure.

Figure 10:
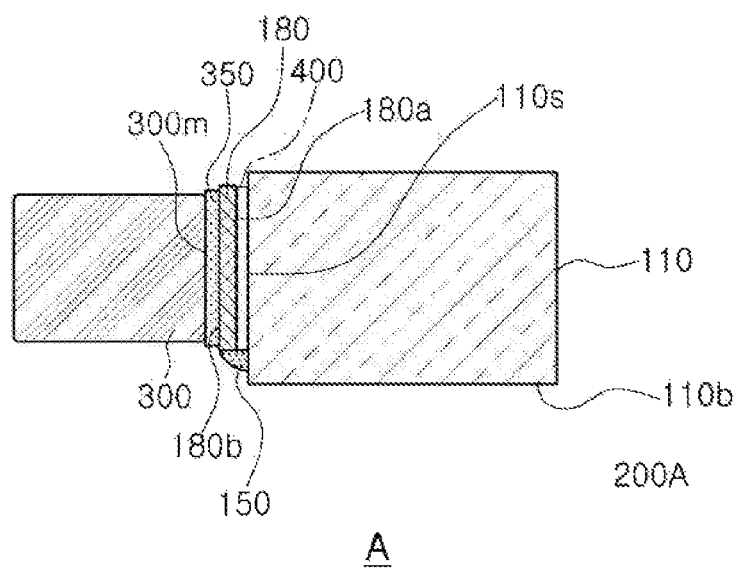
FIG. 10 is a schematic plan view of the antenna module of FIG. 9 when viewed in direction A.

FIG. 10 is a schematic plan view of the antenna module of FIG. 9 when viewed in direction A.

Figure 11:
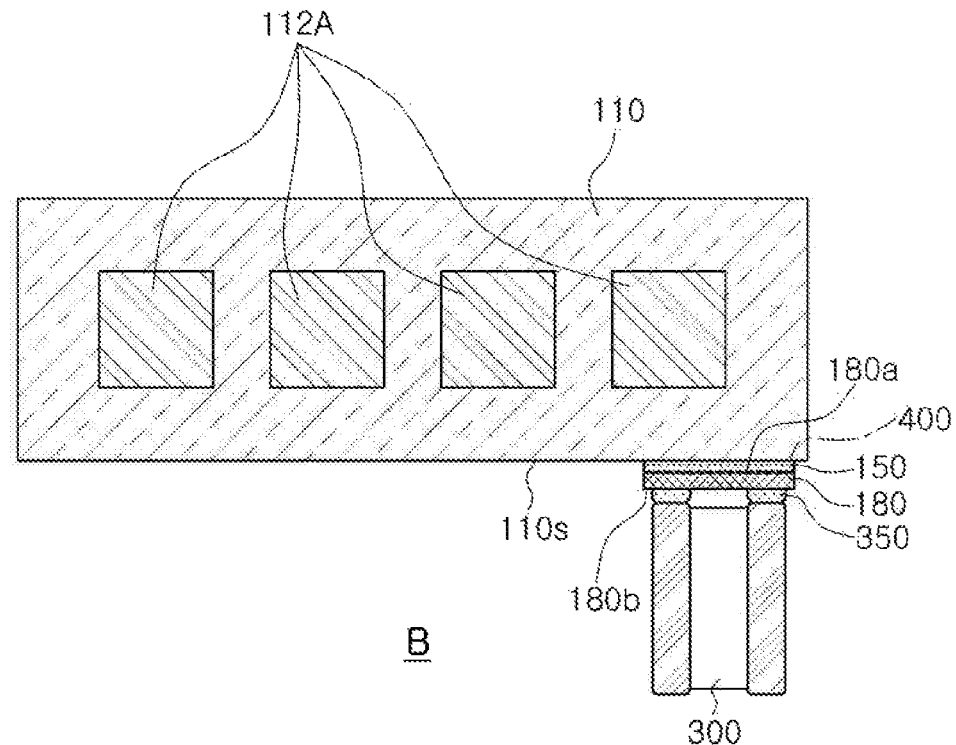
FIG. 11 is a schematic plan view of the antenna module of FIG. 9 when viewed in direction B.

FIG. 11 is a schematic plan view of the antenna module of FIG. 9 when viewed in direction B.

Figure 12:
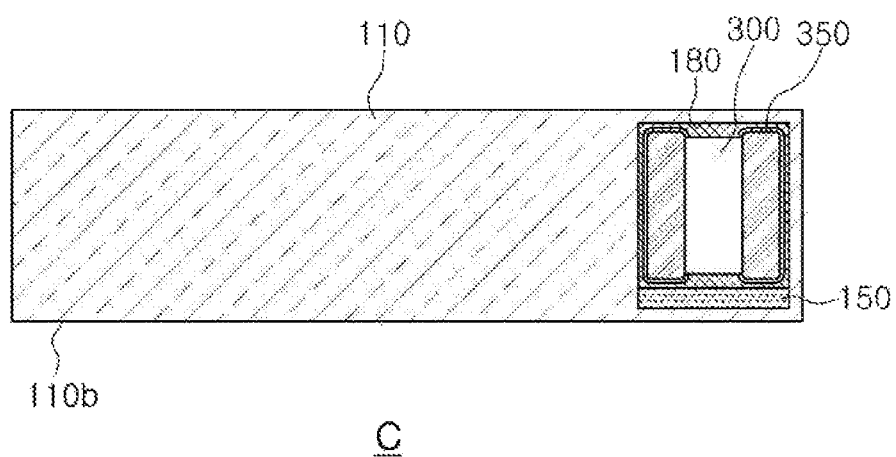
FIG. 12 is a schematic plan view of the antenna module of FIG. 9 when viewed in direction C.

FIG. 12 is a schematic plan view of the antenna module of FIG. 9 when viewed in direction C.

Referring to FIGS. 9 through 12, an antenna module 500A according to an exemplary embodiment in the present disclosure may include an antenna substrate 100 including a first substrate 110 including antenna patterns 112A, a second substrate 180 having a first planar surface 180a and a second planar surface 180b opposing the first planar surface 180a, a flexible substrate 150 connecting the first substrate 110 and the second substrate 180 to each other and bent so that the first planar surface 180a of the second substrate 180 faces a side surface 110s of the first substrate 110; and an electronic component 300 disposed on the second planar surface 180b of the second substrate 180 of the antenna substrate 100.

Recently, in accordance with the trend toward thinness of electronic devices, thicknesses of various components in a mobile device such as a smartphone are significantly limited. Further, recently, in the mobile device, a dual printed circuit board (PCB) is used as a mainboard in accordance with an increase in a capacity of a battery. In this case, since all components are thinned and mounted on the mainboard, it has been required to sufficiently reduce a thickness of the greatest component. Therefore, when a millimeter wave/5G antenna module is used in the mobile device, inevitably there are many limitations in a size, a thickness, and the like, of the millimeter wave/5G antenna module in order to secure a degree of freedom of a mounting position of the millimeter wave/5G antenna module within a set.

Meanwhile, when an antenna module is implemented in a general system-in-package (SIP) type module manner, various semiconductor chips and passive components are mounted on a bottom surface of an antenna substrate by surface mount technology (SMT), and in order to prevent electromagnetic interference (EMI), a shield can covering the semiconductor chips and the passive components is attached to the semiconductor chips and the passive components or the semiconductor chips and the passive components are covered with an epoxy molding compound (EMC), and a metal layer is then formed on an outer surface of the EMC. In this case, since an overall thickness of the module is determined by a passive component, particularly, a component having a great thickness, such as a power inductor (PI), there is a limitation in reducing the overall thickness of the module unless a thickness of the power inductor (PI) is reduced or a method of mounting the power inductor is changed.

On the other hand, the antenna module 500A according to the exemplary embodiment may include the antenna substrate 100 having a rigid-flexible-rigid form, and the electronic component 300 having a great thickness may be disposed on the second planar surface 180b of the second substrate 180 of the antenna substrate 100. In this case, the flexible substrate 150 of the antenna substrate 100 may be bent by approximately 90° so that the first planar surface 180a of the second substrate 180 faces the side surface 110s of the first substrate 110. When the flexible substrate 150 is bent as described above, a mounting surface 300m of the electronic component 300 may face the side surface 110s of the first substrate 110 of the antenna substrate 100, and the electronic component 300 may be disposed to be spaced apart from the side surface 110s of the first substrate 110 of the antenna substrate 100 by a predetermined distance. Therefore, a thickness of the electronic component 300 does not have an influence on an overall thickness of the antenna module 500A, such that the overall thickness of the antenna module 500A may be reduced.

Components of the antenna module 500A according to the exemplary embodiment will hereinafter be described in more detail with reference to the drawings.

The antenna substrate 100 may include the first substrate 110, the second substrate 180, and the flexible substrate 150 connecting the first substrate 110 and the second substrate 180 to each other. The antenna substrate 100 may be a general rigid-flexible PCB (RFPCB) having a plurality of rigid regions and a flexible region connecting the plurality of rigid regions to each other. For example, the first substrate 110 may be one rigid region of the RFPCB, the flexible substrate 150 may be the flexible region of the RFPCB, and the second substrate 180 may be another rigid region of the RFPCB. The second substrate 180 may have an area and a thickness much smaller than those of the first substrate 110. For example, the first substrate 110 may have a rigid PCB structure with a great area of five to ten layers, the second substrate 180 may have a rigid PCB structure with a small area of one to two layers, and the flexible substrate 150 may be a flexible PCB structure with a small area of one to two layers, but the first substrate 110, the second substrate 180, and the flexible substrate 150 are not limited thereto.

The first substrate 110, a region in which a millimeter wave/5G antenna may be implemented, may have a plurality of insulating layers, pattern layers disposed on the insulating layers, respectively, and wiring vias dispose in the insulating layers, respectively, to penetrate through the insulating layers and electrically connecting pattern layers disposed on different levels to each other. The first substrate 110 may have a form of which a length is greater than a width, such as m×n, for example 1×4 as in the drawing on the basis of the antenna patterns 112A. However, the first substrate 110 is not limited thereto, and may also have a form of which a length and a width are substantially the same as each other, such as m×m or n×n, for example, 2×2.

An insulating material may be used as a material of each of the insulating layers of the first substrate 110. In this case, the insulating material may be a thermosetting resin such as an epoxy resin, a thermoplastic resin such as a polyimide resin, a material including a reinforcing material such as a glass fiber (or a glass cloth or a glass fabric) and/or an inorganic filler together with the thermosetting resin and the thermoplastic resin, for example, prepreg, an Ajinomoto Build-up Film (ABF), a photoimagable dielectric (PID), or the like. However, the material of each of the insulating layers is not limited thereto. That is, a glass plate or a ceramic plate may be used as a material of a specific insulating layer. Alternatively, a liquid crystal polymer (LCP) having a low dielectric loss may also be used as the material of the insulating layer in order to reduce signal loss.

The pattern layers of the first substrate 110 may include the antenna patterns 112A. The antenna patterns 112A may be a dipole antenna, a patch antenna, or the like, depending on a disposition and a shape of the antenna patterns 112A. Ground patterns may have a ground plane form. The antenna patterns 112A may be surrounded by ground patterns disposed on the same level, but are not limited thereto. The first substrate 110 may include signal patterns, power patterns, resistor patterns, or the like. A material of each of these patterns may be a conductive material such as copper (Cu), aluminum (Al), silver (Ag), tin (Sn), gold (Au), nickel (Ni), lead (Pb), titanium (Ti), or alloys thereof, but is not limited thereto.

The wiring vias of the first substrate 110 may electrically connect the wiring layers formed on different layers to each other, resulting in an electrical path in the first substrate 110. The wiring vias may include feeding vias, and may include ground vias, and the like. In addition, the wiring vias may include signal vias, power vias, or the like. The feeding vias may be connected to the antenna patterns 112A in an electrical manner and/or a signal manner. Some ground vias may tightly surround the feeding vias. A material of each of the wiring vias may be a conductive material such as copper (Cu), aluminum (Al), silver (Ag), tin (Sn), gold (Au), nickel (Ni), lead (Pb), titanium (Ti), or alloys thereof. Each of the wiring vias may be completely filled with the conductive material, or the conductive material may be formed along a wall of each of via holes. In addition, each of the wiring vias may have a cylindrical shape, an hourglass shape, a tapered shape, or the like.

The flexible substrate 150 may include an insulating material having flexible characteristics. For example, the flexible substrate 150 may include polyimide, polyethylene terephthalate, polyethylene naphthalate, or the like. However, the material of the flexible substrate 150 is not limited thereto, and may any known insulating material having flexible characteristics. Pattern layers electrically connected to the pattern layers of the first substrate 110 and pattern layers of the second substrate 180 may also be formed on the flexible substrate 150. The pattern layers of the flexible substrate 150 may also include signal patterns, power patterns, ground patterns, or the like. A material of each of these patterns may be a conductive material such as copper (Cu), aluminum (Al), silver (Ag), tin (Sn), gold (Au), nickel (Ni), lead (Pb), titanium (Ti), or alloys thereof, but is not limited thereto. If necessary, the flexible substrate 150 may also include wiring vias of one or more layers. The wiring vias may be signal vias, ground vias, power vias, and the like, and a material of each of the wiring vias may be a conductive material such as copper (Cu), aluminum (Al), silver (Ag), tin (Sn), gold (Au), nickel (Ni), lead (Pb), titanium (Ti), or alloys thereof. In addition, the wiring vias may have various shapes as described above.

The second substrate 180 may provide a region on which the electronic component 300 is mounted. The second substrate 180 may also include one or more insulating layers and one or more pattern layers. Prepreg, an ABF, a PID, an LCP, or the like, may also be used as a material of each of the insulating layers of the second substrate 180. The wiring layers of the second substrate 180 may include pad patterns formed on the top surface thereof and connected to the electronic component 300, and may also include signal patterns, power patterns, ground patterns, and the like. A material of each of the pattern layers of the second substrate 180 may be a conductive material such as copper (Cu), aluminum (Al), silver (Ag), tin (Sn), gold (Au), nickel (Ni), lead (Pb), titanium (Ti), or alloys thereof, but is not limited thereto. If necessary, the second substrate 180 may also include wiring vias of one or more layers. The wiring vias may be signal vias, ground vias, power vias, and the like, and a material of each of the wiring vias may be a conductive material such as copper (Cu), aluminum (Al), silver (Ag), tin (Sn), gold (Au), nickel (Ni), lead (Pb), titanium (Ti), or alloys thereof. In addition, the wiring vias may have various shapes as described above.

The side surface 110s of the first substrate 110 of the antenna substrate 100 may be spaced apart from the first planar surface 180a of the second substrate 180 by a predetermined distance. In this case, the first planar surface 180a of the second substrate 180 may be attached to the side surface 110s of the first substrate 110 through an adhesive 400 disposed between the first planar surface 180a of the second substrate 180 and the side surface 110s of the first substrate 110. A material of the adhesive 400 is not particularly limited, and may be any known adhesive film, or the like.

Meanwhile, it has been illustrated that the flexible substrate 150 is connected to the side surface 110s of the first substrate 110 in a width direction and the flexible substrate 150 and the second substrate 180 are disposed on the side surface 110s of the first substrate 110 in the width direction, but the flexible substrate 150 may be connected to the side surface 110s of the first substrate 110 in a length direction and the flexible substrate 150 and the second substrate 180 may be disposed on the side surface 110s of the first substrate 110 in the length direction.

The electronic component 300 may be various components having a great thickness. For example, the electronic component 300 may be a power inductor (PI) that needs to have a great thickness in order to have a high inductance, but is not limited thereto. The electronic component 300 may be surface-mounted on the second planar surface 180b of the second substrate 180 of the antenna substrate 100 through an adhesive 350. The adhesive 350 may include a low melting point metal such as tin (Sn) or alloys including tin (Sn). For example, the adhesive 350 may be a solder adhesive. Therefore, the electronic component 300 may be mounted on the second planar surface 180b of the second substrate 180 of the antenna substrate 100 through soldering, but is not limited thereto. The electronic component 300 may be electrically connected to semiconductor chips 221 and 222 and/or passive components 225 of a semiconductor package 200A through the respective wiring layers of the second substrate 180, the flexible substrate 150, and the first substrate 110 of the antenna substrate 100.

If necessary, the electronic component 300 may be in a state in which it is subjected to electromagnetic wave shielding processing. For example, the electronic component 300 may be surface-mounted on the second planar surface 180b of the second substrate 180 in a packaged state in which it is encapsulated by an encapsulant, or the like. In this case, a metal layer may be formed on an outer surface of the encapsulant by plating, or the like, in order to shield electromagnetic waves.

Figure 13:
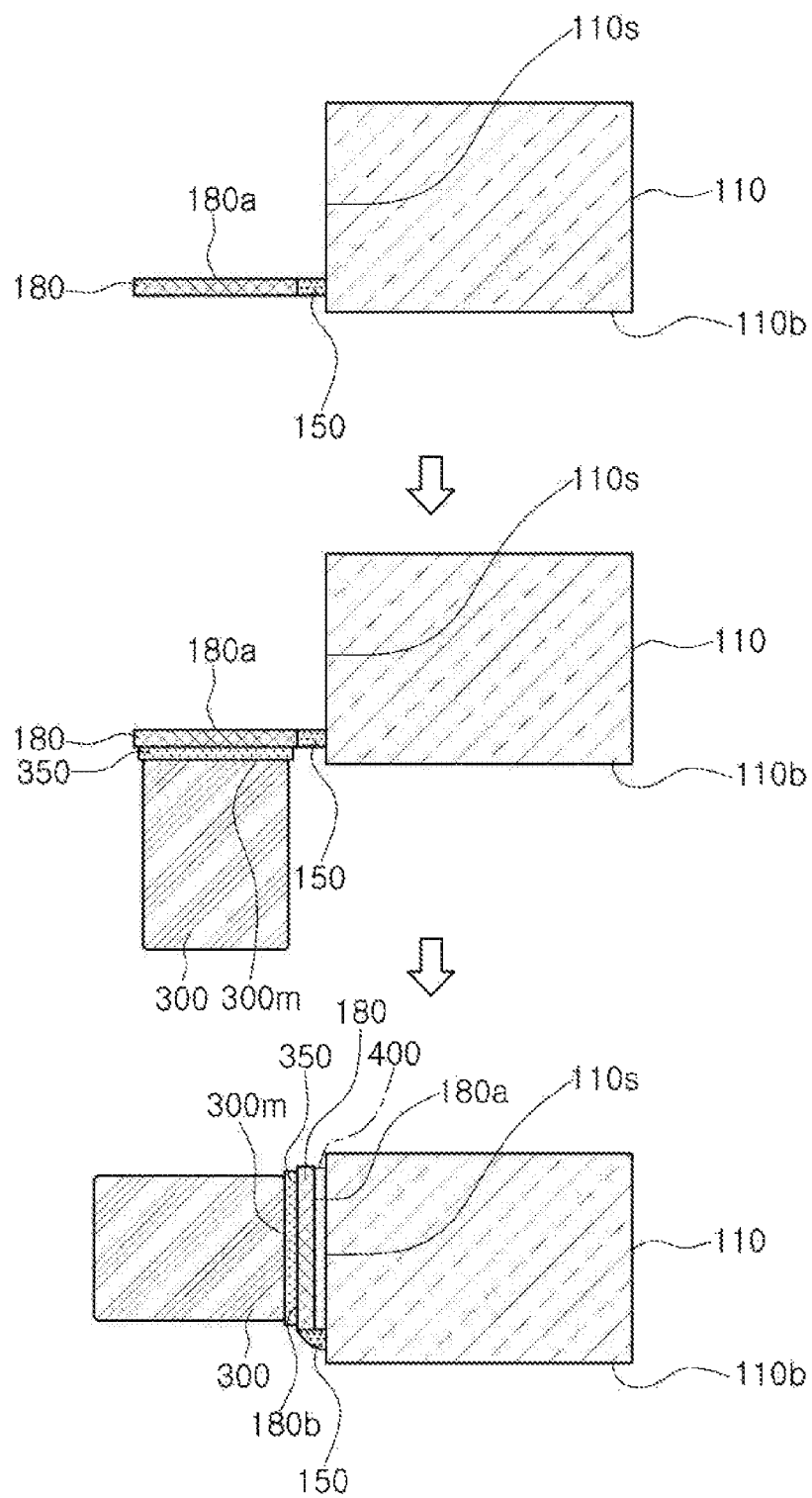
FIG. 13 is schematic views illustrating processes of mounting an electronic component of the antenna module of FIG. 9 in direction A.

FIG. 13 is schematic views illustrating processes of mounting an electronic component of the antenna module of FIG. 9 in direction A.

Figure 14:
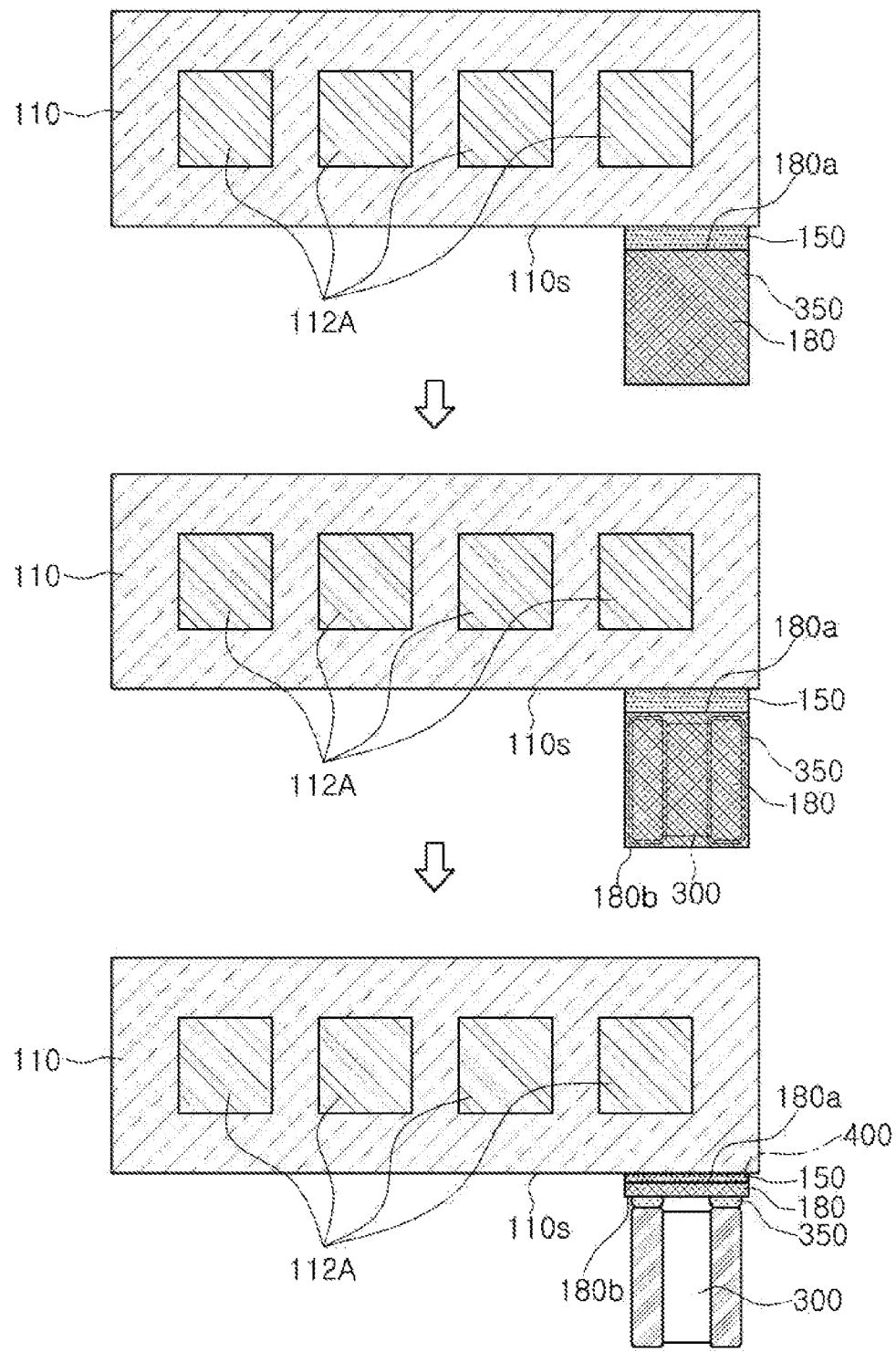
FIG. 14 is schematic views illustrating processes of mounting an electronic component of the antenna module of FIG. 9 in direction B.

FIG. 14 is schematic views illustrating processes of mounting an electronic component of the antenna module of FIG. 9 in direction B.

Figure 15:
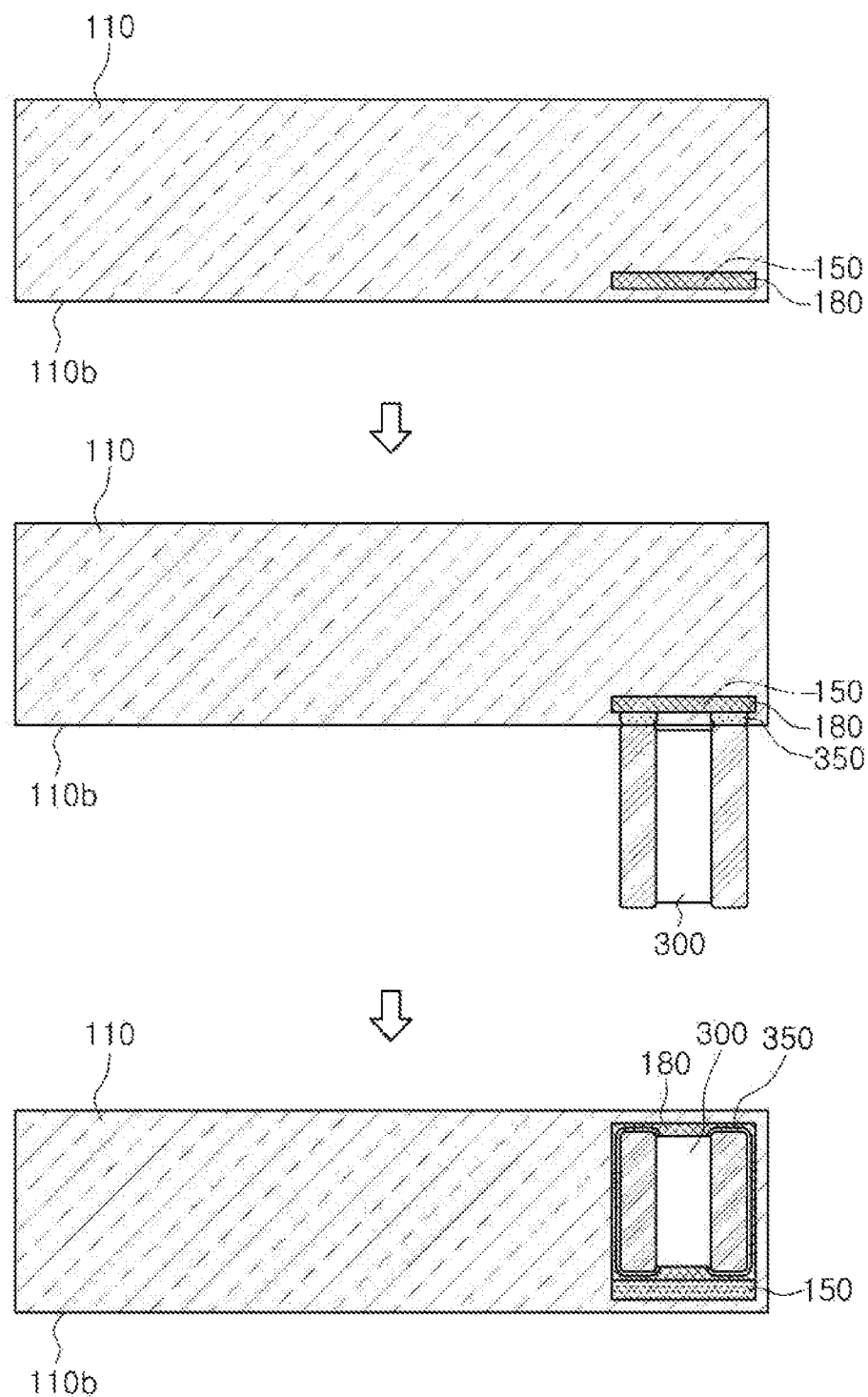
FIG. 15 is schematic views illustrating processes of mounting an electronic component of the antenna module of FIG. 9 in direction C.

FIG. 15 is schematic views illustrating processes of mounting an electronic component of the antenna module of FIG. 9 in direction C.

Referring to FIGS. 13 through 15, the antenna substrate 100 including the first substrate 110, the second substrate 180, and the flexible substrate 150 may first be prepared. Then, the electronic component 300 may be surface-mounted on the second planar surface 180b of the second substrate 180 of the antenna substrate 100. Then, the flexible substrate 150 may be bent by approximately 90° to allow the first planar surface 180a of the second substrate 180 to face the side surface 110s of the first substrate 110. Resultantly, the electronic component 300 may be disposed on the side surface 110s of the first substrate 110 so that the mounting surface 300m thereof faces the side surface 110s of the first substrate 110.

Specifically, as shown in FIG. 13, the flexible substrate 150 may be disposed on a side edge surface of the second substrate 180, and the side surface 110s of the first substrate 110 and the side edge surface of the second substrate 180 may be connected by the flexible substrate 150, such that the second substrate 180 is rotatable with respect to a connected portion of the flexible substrate 150.

Figure 16:
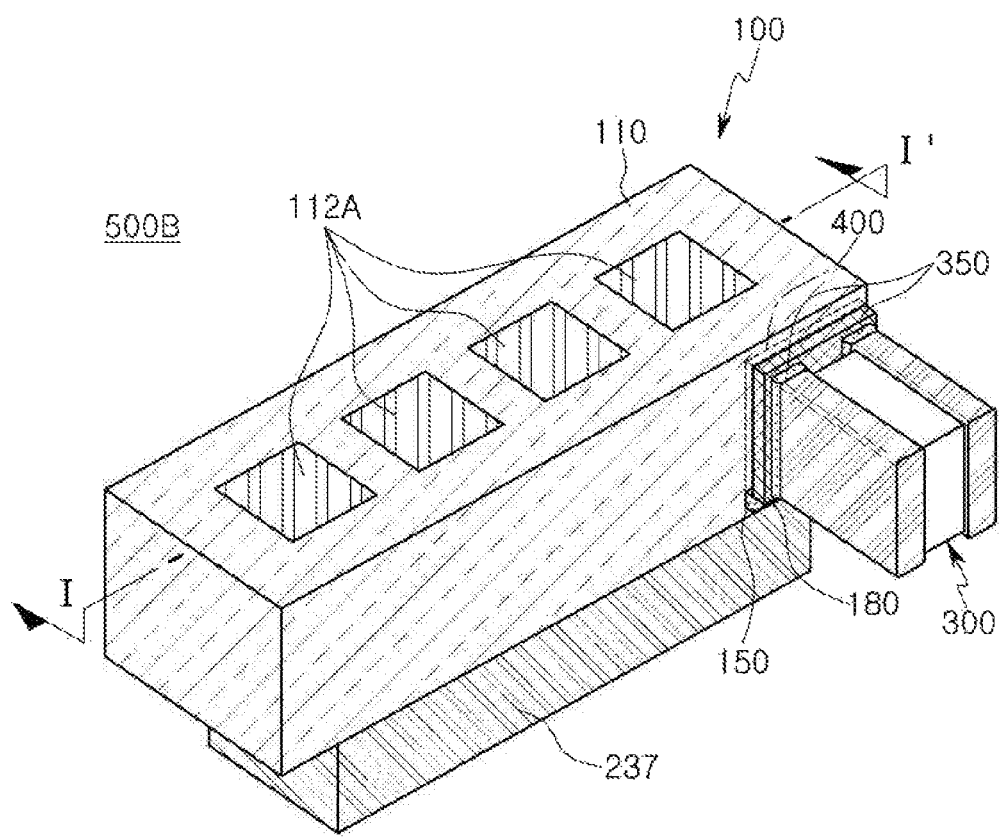
FIG. 16 is a schematic perspective view illustrating an antenna module according to another exemplary embodiment in the present disclosure.

FIG. 16 is a schematic perspective view illustrating an antenna module according to another exemplary embodiment in the present disclosure.

Figure 17:
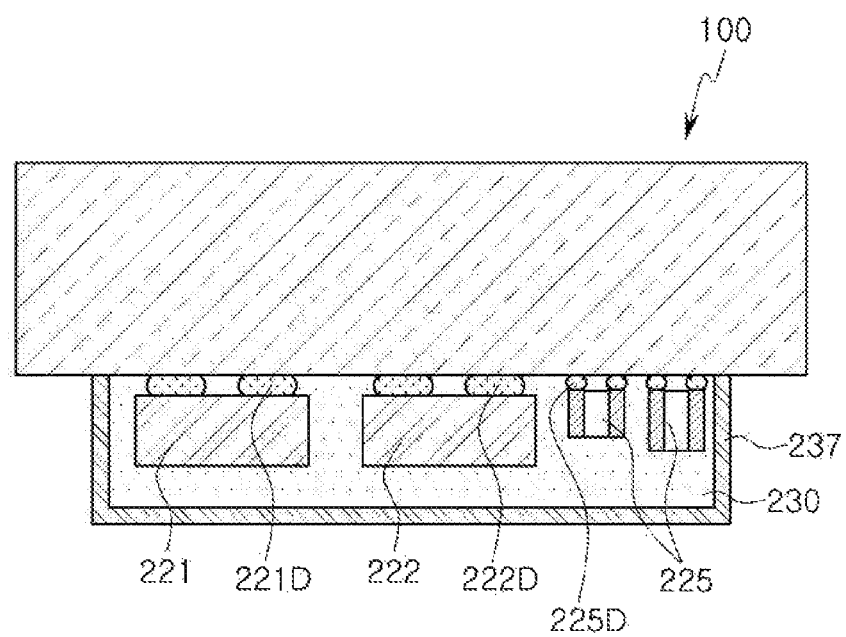
FIG. 17 is a schematic cross-sectional view taken along line I-I' of the antenna module of FIG. 16.

FIG. 17 is a schematic cross-sectional view taken along line I-I' of the antenna module of FIG. 16.

Referring to FIGS. 16 and 17, an antenna module 500B according to another exemplary embodiment in the present disclosure may further include semiconductor chips 221 and 222 surface-mounted on a lower surface 110*b* of a first substrate 110 of an antenna substrate 100, passive components 225 surface-mounted on the lower surface of the first substrate 110 of the antenna substrate 100, an encapsulant 230 disposed on the lower surface 110*b* of the first substrate 110 of the antenna substrate 100 and covering at least portions of each of the semiconductor chips 221 and 222 and the passive components 225, and a metal layer 237 covering outer surfaces of the encapsulant 230. That is, in the antenna module 500B according to another exemplary embodiment, the semiconductor chips 221 and 222 and the passive components 225 having thicknesses smaller than that of the electronic component 300 may be disposed on the lower surface of the first substrate 110 of the antenna substrate 100 and then encapsulated, such that various performances required in the antenna module may be stably implemented even though the antenna module 500B is thin, and electromagnetic waves may be shielded by the metal layer 237, such that various problems caused by electromagnetic interference may be solved. Meanwhile, a detailed shape of a cross section of the first substrate 110 of the antenna substrate 100 is omitted for convenience of explanation.

The semiconductor chips 221 and 222 may include a first semiconductor chip 221 and a second semiconductor chip 222 performing different functions. In this case, the first semiconductor chip 221 may be a radio frequency integrated circuit (RFIC), and the second semiconductor chip 222 may be a power management IC (PMIC). Each of the semiconductor chips 221 and 222 may be a packaged IC, but is not limited thereto. The semiconductor chips 221 and 222 may be surface-mounted on the lower surface of the first substrate 110 of the antenna substrate 100 using solder balls 221D and 222D, or the like, respectively. The semiconductor chips 221 and 222 may be electrically connected to each other through the wiring layers of the first substrate 110 of the antenna substrate 100. Each of the semiconductor chips 221 and 222 may have a thickness smaller than that of the electronic component 300.

The passive component 225 may be any known passive component such as a capacitor, an inductor, or the like. As a non-restrictive example, the passive component 225 may be a capacitor, more specifically, a multilayer ceramic capacitor (MLCC). The number of passive components 225 is not particularly limited, and may be more than that illustrated in the drawing or be less than that illustrated in the drawing. The passive components 225 may be surface-mounted side by side with the semiconductor chips 221 and 222 on the lower surface of the first substrate 110 of the antenna substrate 100 through solder adhesives 225D, or the like. Each of the passive components 225 may have a thickness smaller than that of the electronic component 300.

The encapsulant 230 may be configured to protect the semiconductor chips 221 and 222, the passive components 225, and the like, and provide an insulating region. An encapsulation form of the encapsulant 230 is not particularly limited, and may be a form in which the encapsulant 230 surrounds at least portions of the semiconductor chips 221 and 222 and the passive components 225. Certain materials of the encapsulant 230 are not particularly limited, and may be, for example, an insulating material such as an ABF, or the like. Alternatively, a photoimagable encapsulant (PIE) may be used as the material of the encapsulant 230. The encapsulant 230 may also have a thickness smaller than that of the electronic component 300.

The metal layer 237 may be formed on the outer surfaces of the encapsulant 230 by sputtering, or the like. The metal layer 237 may include a thin conductor layer including any known metal such as copper (Cu). A heat dissipation effect and/or an electromagnetic wave shielding effect may be achieved through the metal layer 237.

Other contents overlap those described above, and a detailed description thereof is thus omitted.

Figure 18:
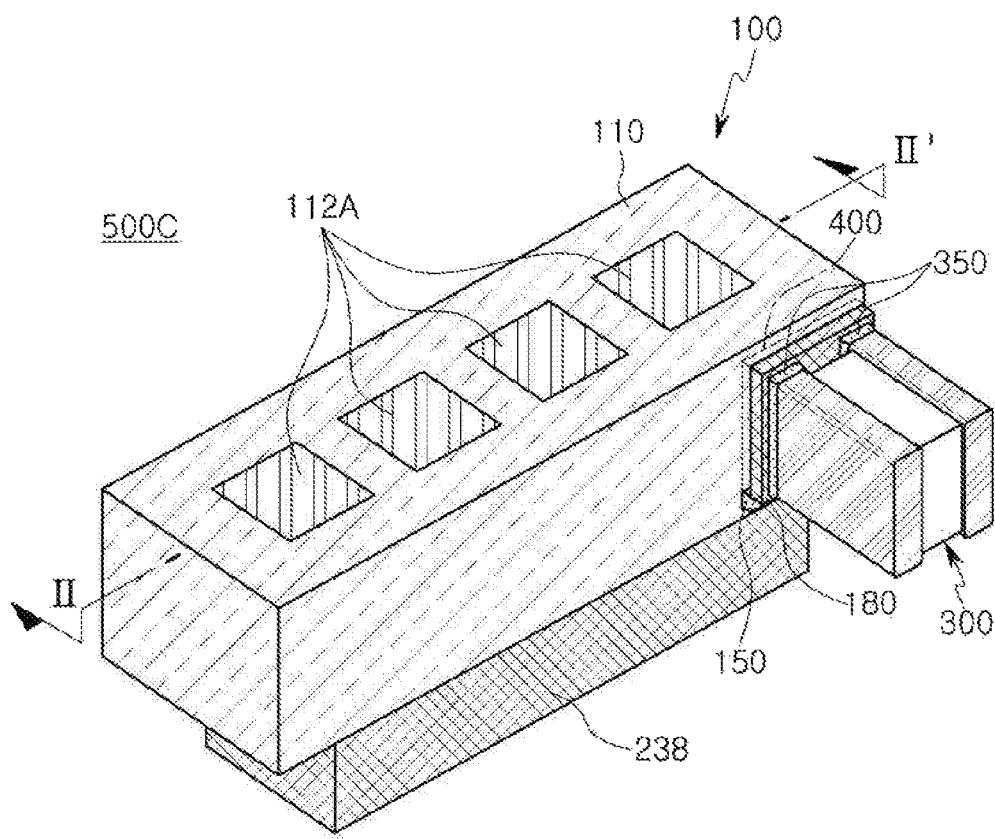
FIG. 18 is a schematic perspective view illustrating an antenna module according to another exemplary embodiment in the present disclosure.

FIG. 18 is a schematic perspective view illustrating an antenna module according to another exemplary embodiment in the present disclosure.

Figure 19:
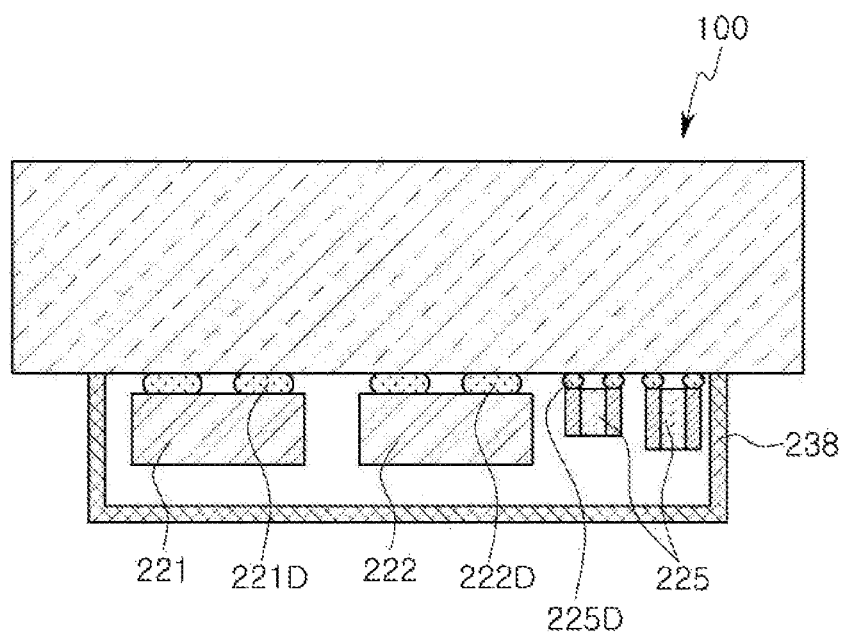
FIG. 19 is a schematic cross-sectional view of taken along line II-II' of the antenna module of FIG. 18.

FIG. 19 is a schematic cross-sectional view of taken along line II-II' of the antenna module of FIG. 18.

Referring to FIGS. 18 and 19, an antenna module 500C according to another exemplary embodiment in the present disclosure may further include semiconductor chips 221 and 222 surface-mounted on a lower surface of a first substrate 110 of an antenna substrate 100, passive components 225 surface-mounted on the lower surface of the first substrate 110 of the antenna substrate 100, and a shield can 238 disposed on the lower surface of the first substrate 110 of the antenna substrate 100 and surrounding the semiconductor chips 221 and 222 and the passive components 225. That is, also in the antenna module 500C according to another exemplary embodiment, the semiconductor chips 221 and 222 and the passive components 225 having thicknesses smaller than that of the electronic component 300 may be disposed on the lower surface of the first substrate 110 of the antenna substrate 100 and be surrounded by the shield can, such that various performances required in the antenna module may be stably implemented even though the antenna module 500C is thin, and various problems caused by electromagnetic interference may be solved. Meanwhile, a detailed shape of a cross section of the first substrate 110 of the antenna substrate 100 is omitted for convenience of explanation.

Any known shield can including a metal may be used as the shield can 238. An inner portion of the shield can 238 may be empty except for the semiconductor chips 221 and 222 and the passive components 225.

Other contents overlap those described above, and a detailed description thereof is thus omitted.

Figure 20:
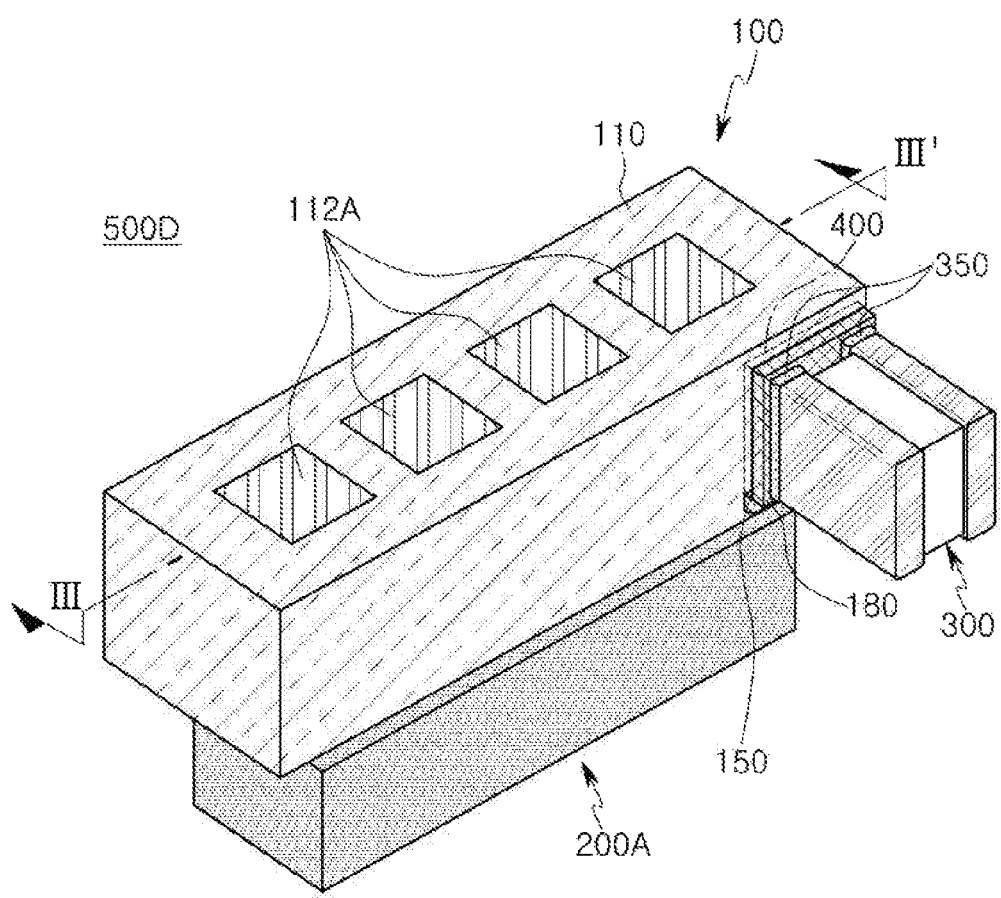
FIG. 20 is a schematic perspective view illustrating an antenna module according to another exemplary embodiment in the present disclosure.

FIG. 20 is a schematic perspective view illustrating an antenna module according to another exemplary embodiment in the present disclosure.

Figure 21:
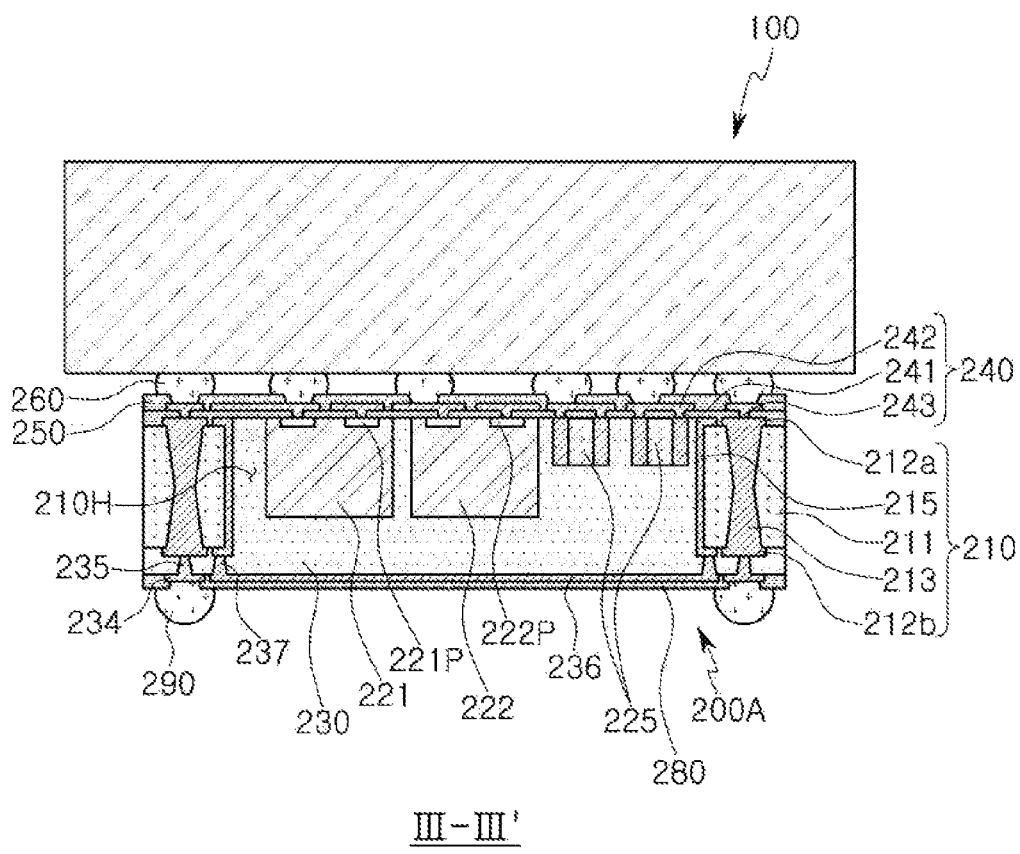
FIG. 21 is a schematic cross-sectional view taken along line III-III' of the antenna module of FIG. 20.

FIG. 21 is a schematic cross-sectional view taken along line III-III' of the antenna module of FIG. 20.

Referring to FIGS. 20 and 21, an antenna module 500D according to another exemplary embodiment may include a semiconductor package 200A mounted on a lower surface of a first substrate 110 of an antenna substrate 100. That is, in the antenna module 500D according to another exemplary embodiment, semiconductor chips 221 and 222 and passive components 225 are not surface-mounted on the lower surface of the first substrate 110 of the antenna substrate 100, but may be embedded and packaged together in a package form using a connection structure 240 and be disposed on the lower surface of the first substrate 110 of the antenna substrate 100 in a package state 200A. Therefore, a bare die rather than a packaged die may be used as each of the semiconductor chips 221 and 222, and an embedded component may be used as each of the passive components 225, and a thickness of the semiconductor package 200B may thus be further reduced. Resultantly, a thickness of the antenna module 500D may further be reduced. Meanwhile, electrical connection structures 260 are omitted in FIG. 20 for convenience of explanation, and a detailed form of a cross section of the first substrate 110 of the antenna substrate 100 is omitted in FIG. 21.

The semiconductor package 200A may include a frame 210 having a through-hole 210H and including a plurality of wiring layers 212a and 212b, a first semiconductor chip 221 disposed in the through-hole 210H and having a first active surface having first connection pads 221P disposed thereon and a first inactive surface opposing the first active surface, a second semiconductor chip 222 disposed in the through-hole 210H and having a second active surface having second connection pads 222P disposed thereon and a second inactive surface opposing the second active surface, the passive components 225 disposed in the through-hole 210H, an encapsulant 230 covering at least portions of each of the frame 210, the first inactive surface of the first semiconductor chip 221, the second inactive surface of the second semiconductor chip 222, and the passive components 225 and filling at least portions of the through-hole 210H, and a connection structure 240 disposed on the frame 210, the first active surface of the first semiconductor chip 221, the second active surface of the second semiconductor chip 222, and the passive components 225 and including redistribution layers 242 electrically connected to each of the first connection pads 221P, the second connection pads 222P, and the passive components 225.

The frame 210 may include the wiring layers 212a and 212b to thus reduce the number of layers of the connection structure 240. In addition, the frame 210 may improve rigidity of the semiconductor package 200B depending on certain materials of an insulating layer 211, and serve to secure uniformity of a thickness of the encapsulant 230. A vertical electrical path may be provided in the semiconductor package 200A by the wiring layers 212a and 212b and connection vias 213 of the frame 210. The frame 210 may have the through-hole 210H. The semiconductor chips 221 and 222 and the passive components 225 may be disposed side by side in the through-hole 210H to be spaced apart from the frame 210 by a predetermined distance. Side surfaces of the semiconductor chips 221 and 222 and the passive components 225 may be surrounded by the frame 210. However, such a form is only an example and may be variously modified to have other forms, and the frame 210 may perform another function depending on such a form.

The frame 210 may include an insulating layer 211, a first wiring layer 212a disposed on an upper surface of the insulating layer 211, a second wiring layer 212b disposed on a lower surface of the insulating layer 211, and connection vias 213 penetrating through the insulating layer 211 and electrically connecting the first and second wiring layers 212a and 212b to each other. The first and second wiring layers 212a and 212b of the frame 210 may have thicknesses greater than those of redistribution layers 242a and 242b of the connection structure 240. Since the frame 210 may have a thickness similar to or greater than that of the semiconductor chips 221 and 222, or the like, the first and second wiring layers 212a and 212b may also be formed to have large sizes through a substrate process depending on a scale of the frame 210. On the other hand, the redistribution layers 242a and 242b of the connection structure 240 may be formed to have small sizes through a semiconductor process for thinness.

A material of the insulating layer 211 is not particularly limited. For example, an insulating material may be used as the material of the insulating layer 211. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, or the like, but is not limited thereto. For example, a glass or a ceramic based insulating material having required material characteristics may be used as the material of the insulating layer 211.

The wiring layers 212a and 212b may serve to redistribute the connection pads 221P and 222P of the semiconductor chips 221 and 222. In addition, the wiring layers 212a and 212b may be used as connection patterns when the semiconductor package 200B is electrically connected to other components disposed on and beneath the semiconductor package 200A. A material of each of the wiring layers 212a and 212b may be a conductive material such as copper (Cu), aluminum (Al), silver (Ag), tin (Sn), gold (Au), nickel (Ni), lead (Pb), titanium (Ti), or alloys thereof. The wiring layers 212a and 212b may perform various functions depending on designs of corresponding layers. For example, the wiring layers 212a and 212b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 212a and 212b may include via pads, and the like.

The connection vias 213 may electrically connect the wiring layers 212a and 212b formed on different layers to each other, resulting in an electrical path in the frame 210. A material of each of the connection vias 213 may be a conductive material such as copper (Cu), aluminum (Al), silver (Ag), tin (Sn), gold (Au), nickel (Ni), lead (Pb), titanium (Ti), or alloys thereof. Each of the connection vias 213 may be completely filled with the conductive material, or the conductive material may be formed along a wall of each of connection via holes. In addition, each of the connection vias 213 may have any known shape such as an hourglass shape, a cylindrical shape, and the like. The connection vias 213 may also include signal connection vias, ground connection vias, and the like.

A metal layer 215 may further be disposed on a wall of the through-hole 210H of the frame 210, if necessary. The metal layer 215 may be formed over the entire wall of the through-hole 210H to surround the semiconductor chips 221 and 222 and the passive components 225. Therefore, heat dissipation characteristics may be improved, and an electromagnetic wave shielding effect may be achieved. The metal layer 215 may extend to an upper surface and a lower surface of the frame 210, that is, the upper surface and the lower surface of the insulating layer 211. A material of the metal layer 215 may be a conductive material such as copper (Cu), aluminum (Al), silver (Ag), tin (Sn), gold (Au), nickel (Ni), lead (Pb), titanium (Ti), or alloys thereof. The metal layer 215 may be electrically connected to ground patterns and/or power patterns of the first wiring layer 212a and/or the second wiring layer 212b to be used as a ground plane.

Each of the semiconductor chips 221 and 222 may be an integrated circuit (IC) in a bare state or a packaged state, provided in an amount of several hundred to several million or more elements integrated in a single chip. For example, the IC of the first semiconductor chip 221 may be an RFIC, and the IC of the second semiconductor chip 222 may be a PMIC. The semiconductor chips 221 and 222 may include bodies on which various circuits are formed, respectively, and the connection pads 221P and 222P may be formed on active surfaces of the bodies, respectively. The body may be formed on the basis of, for example, an active wafer. In this case, a base material of the body may be silicon (Si), germanium (Ge), gallium arsenide (GaAs), or the like. The connection pads 221P and 222P may electrically connect the semiconductor chips 221 and 222 to other components, respectively, and a material of each of the connection pads 221P and 222P may be a conductive material such as aluminum (Al), but is not limited thereto. The active surfaces of the semiconductor chips 221 and 222 refer to surfaces of the semiconductor chip 221 and 222 on which the connection pads 221P and 222P are disposed, and the inactive surfaces of the semiconductor chips 221 and 222 refer to surfaces of the semiconductor chips 221 and 222 opposing the active surfaces. Passivation layers having openings exposing at least portions of the connection pads 221P and 222P and formed of an oxide layer, a nitride layer, or the like, may be formed on the active surfaces of the semiconductor chips 221 and 222. The semiconductor chips 221 and 222 may be disposed in a face-up form to thus have minimum signal paths up to the antenna substrate 100.

The passive component 225 may be any known passive component such as a capacitor, an inductor, or the like. As a non-restrictive example, the passive component 225 may be at least one of a MLCC and a power inductor. The passive components 225 may be electrically connected to the connection pads 221P and 222P of the semiconductor chips 221 and 222 through the connection structure 240. The number of passive components 225 is not particularly limited. In the semiconductor package 200B according to another exemplary embodiment, a plurality of passive components 225 may be disposed together with the semiconductor chips 221 and 222 in one package. Therefore, an interval between components may be significantly reduced, and the semiconductor package 200B may thus be miniaturized. In addition, electrical paths between the semiconductor chips 221 and 222 and the passive components 225 may be significantly reduced to suppress noise.

The encapsulant 230 may be configured to protect the semiconductor chips 221 and 222, the passive components 225, and the like, and provide an insulating region. An encapsulation form of the encapsulant 230 is not particularly limited, and may be a form in which the encapsulant 230 surrounds at least portions of the semiconductor chips 221 and 222 and the passive components 225. For example, the encapsulant 230 may cover the lower surface of the frame 210, cover side surfaces and the inactive surfaces of the semiconductor chips 221 and 222, and cover side surfaces and lower surfaces of the passive components 225. In addition, the encapsulant 230 may fill at least portions of the through-hole 210H. Certain materials of the encapsulant 230 are not particularly limited, and may be, for example, an insulating material such as an ABF, or the like. Alternatively, a PIE may be used as the material of the encapsulant 230.

A backside wiring layer 234 and a backside metal layer 236 may be disposed on a lower surface of the encapsulant 230. The backside wiring layer 234 may be connected to the second wiring layer 212b of the frame 210 through backside connection vias 235 penetrating through the encapsulant 230. The backside metal layer 236 may be connected to the metal layer 215 of the frame 210 through backside metal vias 237 penetrating through the encapsulant 230. Each of the backside wiring layer 234, the backside metal layer 236, the backside connection vias 235, and the backside metal vias 237 may include a conductive material such as copper (Cu), aluminum (Al), silver (Ag), tin (Sn), gold (Au), nickel (Ni), lead (Pb), titanium (Ti), or alloys thereof. The backside wiring layer 234 may include signal patterns, signal via pads, or the like. The backside metal layer 236 may cover the inactive surfaces of the semiconductor chips 221 and 222 and the passive components 225, and may be connected to the metal layer 215 through the backside metal vias 237 to implement an excellent heat dissipation effect and an excellent electromagnetic wave shielding effect. The backside metal layer 236 may be connected to the ground patterns and/or the power patterns of the wiring layers 212a and 212b of the frame 210 to be used as a ground.

The connection structure 240 may redistribute the connection pads 221P and 222P of the semiconductor chips 221 and 222. Several tens to several hundreds of connection pads 221P and 222P of the semiconductor chips 221 and 222 having various functions may be redistributed by the connection structure 240. In addition, the connection structure 240 may electrically connect the connection pads 221P and 222P of the semiconductor chips 221 and 222 to the passive components 225. In addition, the connection structure 240 may provide an electrical connection path between the semiconductor package 200A and the first substrate 110 of the antenna substrate 100. The connection structure 240 may include insulating layers 241, redistribution layers 242, and connection vias 243. The connection structure 240 may also include insulating layers 241, redistribution layers 242, and connection vias 243 of which the numbers are more than those illustrated in the drawings.

A material of the insulating layer 241 may be a PID. In this case, a fine pitch may be introduced through photo-vias, and several tens to several hundreds of connection pads 221P and 222P of the semiconductor chips 221 and 222 may thus be very effectively redistributed as in a general case. When the number of insulating layers 241 is plural, the insulating layers 241 may include the same insulating material or different insulating materials.

The redistribution layers 242 may redistribute the connection pads 221P and 222P of the semiconductor chips 221 and 222 and/or electrodes of the passive components 225 to electrically connect the connection pads 221P and 222P of the semiconductor chips 221 and 222 and the electrodes of the passive components 225 to first electrical connection structures 260. That is, the redistribution layers 242 may serve as redistribution layers (RDLs). A material of each of the redistribution layers 242 may be a conductive material such as copper (Cu), aluminum (Al), silver (Ag), tin (Sn), gold (Au), nickel (Ni), lead (Pb), titanium (Ti), or alloys thereof. The redistribution layers 242 may perform various functions depending on their designs. For example, the redistribution layers 242 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 242 may include via pads, electrical connection structure pads, and the like.

The connection vias 243 may electrically connect the passive components 225 and the redistribution layers 242 to each other or electrically connect the connection pads 221P and 222P of the semiconductor chips 221 and 222 and the redistribution layers 242 to each other. A material of each of the connection vias 243 may be a conductive material such as copper (Cu), aluminum (Al), silver (Ag), tin (Sn), gold (Au), nickel (Ni), lead (Pb), titanium (Ti), or alloys thereof. Each of the connection vias 243 may be completely filled with the conductive material, or the conductive material may also be formed along a wall of each of via holes. In addition, each of the connection vias 243 may have a tapered shape.

A first passivation layer 250 may be disposed on the connection structure 240. The first passivation layer 250 may protect the connection structure 240 from external physical or chemical damage. The first passivation layer 250 may have openings exposing at least portions of the redistribution layer 242 of the connection structure 240. The number of openings formed in the first passivation layer 250 may be several tens to several thousands. The first passivation layer 250 may include an insulating resin and an inorganic filler, but may not include a glass fiber. For example, the first passivation layer 250 may be formed of an ABF. However, the first passivation layer 250 is not limited thereto, and may also be formed of a PID, a solder resist, or the like.

A plurality of first electrical connection structures 260 electrically connected to the exposed redistribution layer 242 may be disposed on the openings 251 of the first passivation layer 250. The first electrical connection structures 260 may be configured to physically and/or electrically connect the semiconductor package 200A to the first substrate 110 of the antenna substrate 100 described above. Each of the first electrical connection structures 260 may be formed of a low melting point metal, for example, tin (Sn) or an alloy including tin (Sn), more specifically, a solder. However, this is only an example, and a material of each of the first electrical connection structures 260 is not particularly limited thereto.

Each of the first electrical connection structures 260 may be a land, a ball, a pin, or the like. The first electrical connection structures 260 may be formed as a multilayer or single layer structure. When the first electrical connection structures 260 are formed as a multilayer structure, the first electrical connection structures 260 may include a copper (Cu) pillar and a solder. When the first electrical connection structures 260 are formed as a single layer structure, the first electrical connection structures 260 may include a tin-silver solder or copper (Cu). However, this is only an example, and the first electrical connection structures 260 are not limited thereto. The number, an interval, a disposition, or the like, of first electrical connection structures 260 are not particularly limited, but may be sufficiently modified by a person skilled in the art depending on design particulars. At least one of the first electrical connection structures 260 may be disposed in a fan-out region. The fan-out region refers to a region except for a region in which the semiconductor chips 221 and 222 are disposed. The fan-out package may have excellent reliability as compared to a fan-in package, may implement a plurality of input/output (I/O) terminals, and may facilitate a 2D interconnection. In addition, as compared to a ball grid array (BGA) package, a land grid array (LGA) package, or the like, the fan-out package may be manufactured to have a small thickness, and may have price competitiveness.

A second passivation layer 280 covering at least portions of the backside wiring layer 234 and/or the backside metal layer 236 may be disposed beneath the encapsulant 230. The second passivation layer 280 may protect the backside wiring layer 234 and/or the backside metal layer 236 from external physical or chemical damage. The second passivation layer 280 may also include an insulating resin and an inorganic filler, but may not include a glass fiber. For example, the second passivation layer 280 may be formed of an ABF. However, the second passivation layer 280 is not limited thereto, and may also be formed of a PID, a solder resist, or the like.

The second passivation layer 280 may have openings exposing at least portions of the backside wiring layer 234 and/or the backside metal layer 236, and a plurality of second electrical connection structures 290 may be disposed on the openings. The second electrical connection structures 290 may physically and/or electrically connect the antenna module 500D to a mainboard, or the like, if necessary. Each of the second electrical connection structures 290 may be formed of a low melting point metal, for example, tin (Sn) or an alloy including tin (Sn), more specifically, a solder. However, this is only an example, and a material of each of the second electrical connection structures 290 is not particularly limited thereto.

Each of the second electrical connection structures 290 may be a land, a ball, a pin, or the like. The second electrical connection structures 290 may be formed as a multilayer or single layer structure. When the second electrical connection structures 290 are formed as a multilayer structure, the second electrical connection structures 290 may include a copper (Cu) pillar and a solder. When the second electrical connection structures 290 are formed as a single layer structure, the second electrical connection structures 290 may include a tin-silver solder or copper (Cu). However, this is only an example, and the second electrical connection structures 290 are not limited thereto. The number, an interval, a disposition, or the like, of second electrical connection structures 290 are not particularly limited, but may be sufficiently modified by a person skilled in the art depending on design particulars. At least one of the second electrical connection structures 290 may be disposed in a fan-out region. The fan-out region refers to a region except for a region in which the semiconductor chips 221 and 222 are disposed. The fan-out package may have excellent reliability as compared to a fan-in package, may implement a plurality of input/output (I/O) terminals, and may facilitate a 2D interconnection. In addition, as compared to a ball grid array (BGA) package, a land grid array (LGA) package, or the like, the fan-out package may be manufactured to have a small thickness, and may have price competitiveness.

Other contents overlap those described above, and a detailed description thereof is thus omitted.

Figure 22:
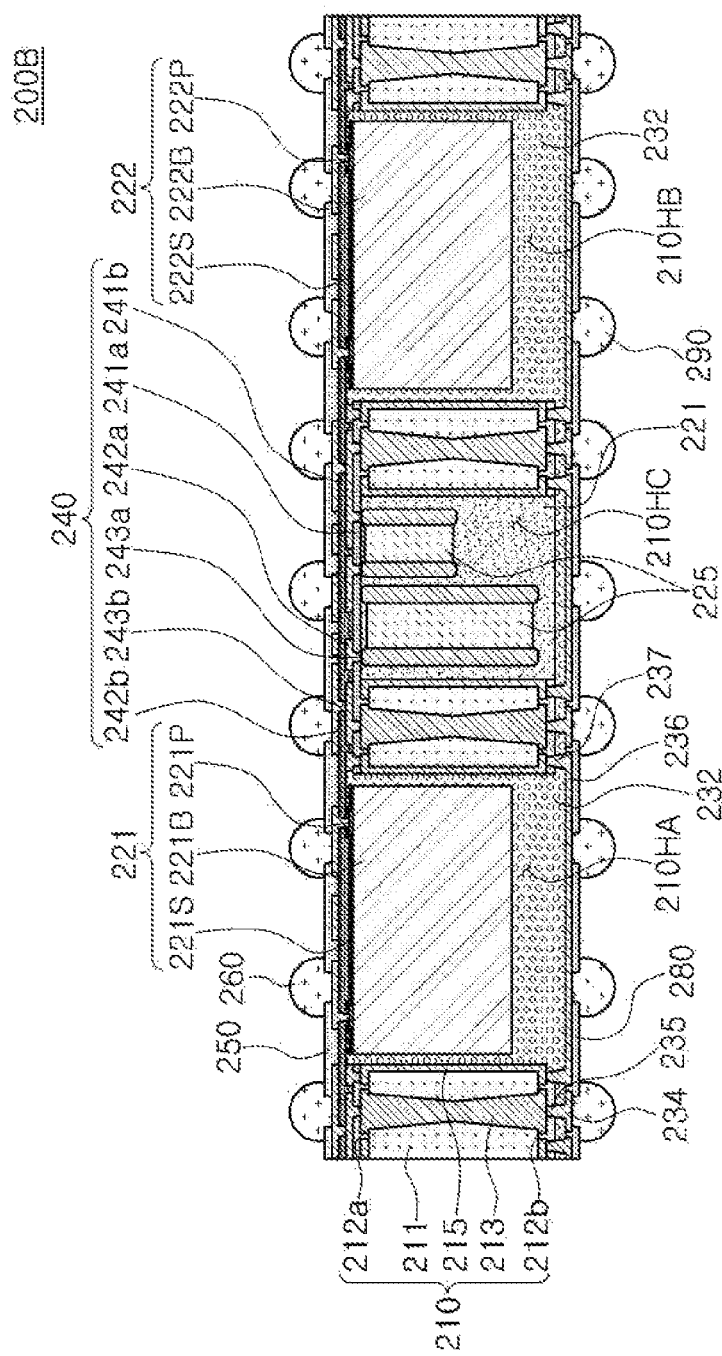
FIG. 22 is a schematic cross-sectional view illustrating a semiconductor package according to another exemplary embodiment used in the antenna module of FIG. 20.

FIG. 22 is a schematic cross-sectional view illustrating a semiconductor package according to another exemplary embodiment used in the antenna module of FIG. 20.

Referring to FIG. 22, in a semiconductor package 200B according to another exemplary embodiment, a frame 210 may have first, second, and third through-holes 210HA, 210HB, and 210HC, and first and second semiconductor chips 221 and 222 and passive components 225 may be disposed in the first to third through-holes 210HA, 210HB, and 210HC, respectively. The semiconductor chips 221 and 222 may include bodies 221B and 222B on which various circuits are formed, respectively, and connection pads 221P and 222P may be formed on active surfaces of the bodies 221B and 222B, respectively. Passivation layers 221S and 222S having openings exposing at least portions of the connection pads 221P and 222P and formed of an oxide layer, a nitride layer, or the like, may be formed on the active surfaces of the semiconductor chips 221 and 222.

Meanwhile, in another exemplary embodiment, encapsulants 231 and 232 may include a first encapsulant 231 covering at least portions of each of a frame 210 and the passive components 225 and filling at least portions of the third through-hole 210HC and a second encapsulant 232 covering at least portions of each of the first encapsulant 231 and the first and second semiconductor chips 221 and 222 and filling at least portions of each of the first and second through-holes 210HA and 210HB. As described above, when two or more encapsulating processes rather than one encapsulating process are performed, a yield problem of the semiconductor chips 221 and 222 due to a mounting defect of the passive components 225 or an influence of foreign materials occurring at the time of mounting the passive components 225 may be significantly reduced.

Meanwhile, in another exemplary embodiment, a connection structure 240 may include a first insulating layer 241a disposed on the frame 210 and the passive components 225, a first redistribution layer 242a disposed on an upper surface of the first insulating layer 241a, first connection vias 243a penetrating through the first insulating layer 241a and electrically connecting the passive components 225 and the first redistribution layer 242a to each other, a second insulating layer 241b disposed on the upper surface of the first insulating layer 241a and the active surfaces of the semiconductor chips 221 and 222 and covering at least portions of the first redistribution layer 242a, a second redistribution layer 242b disposed on an upper surface of the second insulating layer 241b, and second connection vias 243b penetrating through the second insulating layer 241b and electrically connecting the first and second redistribution layers 242a and 242b, the connection pads 221P and 222P of the semiconductor chips 221 and 222, and the second redistribution layer 242b to each other.

A material of the first insulating layer 241a may be an insulating material. In this case, the insulating material may be a non-photosensitive insulating material including an inorganic filler such as silica or alumina, for example, an ABF. In this case, an undulation problem and a defect problem due to occurrence of a crack may be more effectively solved. In addition, a defect problem in which electrodes of the passive components 225 are opened due to bleeding of a material of the first encapsulant 231 may also be effectively solved. That is, when the non-photosensitive insulating material including the inorganic filler is used as the material of the first insulating layer 241a, a problem occurring when a PID is used as the material of the first insulating layer 241a may be more effectively solved.

A material of the second insulating layer 241b may be a PID. In this case, a fine pitch may be introduced through photo-vias, and several tens to several hundreds of connection pads 221P and 222P of the semiconductor chips 221 and 222 may thus be very effectively redistributed as in a general case. The PID may include a small amount of inorganic filler or may not include the inorganic filler. That is, materials of the first redistribution layer 242a for redistributing the passive components 225, the first insulating layer 241a in which the first connection vias 243a are formed, the second redistribution layer 242b for redistributing the connection pads 221P and 222P of the semiconductor chips 221 and 222, and the second insulating layer 241b in which the second connection vias 243b are formed may be selectively controlled, resulting in a more excellent synergy effect. If necessary, a PID having a low dielectric dissipation factor may be used as the material of the second insulating layer 241b.

If necessary, the first insulating layer 241a formed of the non-photosensitive insulating material including the inorganic filler may be a plurality of layers, the second insulating layer 241b formed of the PID may be a plurality of layers, and both of the first insulating layer 241a and the second insulating layer 241b may be a plurality of layers.

The first and second through-holes 210HA and 210HB may penetrate through the first insulating layer 241a formed of the non-photosensitive insulating material, and when the first insulating layer 241a is the plurality of layers, the first and second through-holes 210H and 210HB may penetrate through all of the plurality of layers. That is, depths of the first and second through-holes 210HA and 210HB may be deeper than that of the third through-hole 210HC, and bottom surfaces of the first and second through-holes 210HA and 210HB may be disposed on a level above a bottom surface of the third through-hole 210HC. That is, these bottom surfaces may have a step therebetween. The bottom surfaces of the first and second through-holes 210HA and 210HB may be a lower surface of the second insulating layer 241b, and the bottom surface of the third through-hole 210H may be a lower surface of the first insulating layer 241a. The active surfaces of the semiconductor chips 221 and 222 may be disposed on a level below lower surfaces of the passive component 225. For example, the active surfaces of the semiconductor chips 221 and 222 may be substantially coplanar with an upper surface of a first wiring layer 212a. That is, the first insulating layer 241a and the first redistribution layer 242a may be primarily formed in order to redistribute the passive components 225, and the second insulating layer 241b and the second redistribution layer 242b may then be formed on another level in order to redistribute the semiconductor chips 221 and 222. In this case, an undulation problem and a crack occurrence problem may be more effectively solved.

The first insulating layer 241a may have a coefficient of thermal expansion (CTE) smaller than that of the second insulating layer 241b. The reason is that the first insulating layer 241a includes an inorganic filler 241af. The second insulating layer 241b may also include a small amount of inorganic filler, if necessary. However, in this case, a weight percent of the inorganic filler included in the first insulating layer 241a may be larger than that of the inorganic filler included in the second insulating layer 241b. Therefore, the CTE of the first insulating layer 241a may be smaller than that of the second insulating layer 241b. Since the first insulating layer 241a having a relatively larger amount of inorganic filler to have a relatively small CTE is advantageous in view of suppression of warpage due to low heat hardening contraction, the undulation problem and the crack occurrence problem as described above may be effectively solved, and a defect problem in which electrodes of the passive components 225 are opened may also be effectively solved.

The first redistribution layer 242a may redistribute the electrodes of the passive components 225 to electrically connect the electrodes of the passive components 225 to the connection pads 221P and 222P of the semiconductor chips 221 and 222. That is, the first redistribution layers 242a may serve as redistribution layers (RDLs). A material of the first redistribution layer 242a may be a conductive material such as copper (Cu), aluminum (Al), silver (Ag), tin (Sn), gold (Au), nickel (Ni), lead (Pb), titanium (Ti), or alloys thereof. The first redistribution layer 242a may perform various functions depending on a design. For example, the first redistribution layers 242a may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first redistribution layer 242a may include via pads, and the like.

The second redistribution layers 242b may redistribute the connection pads 221P and 222P of the semiconductor chips 221 and 222 to electrically connect the connection pads 221P and 222P of the semiconductor chips 221 and 222 to first electrical connection structures 260. That is, the second redistribution layers 242b may serve as redistribution layers (RDLs). A material of the second redistribution layer 242b may be a conductive material such as copper (Cu), aluminum (Al), silver (Ag), tin (Sn), gold (Au), nickel (Ni), lead (Pb), titanium (Ti), or alloys thereof. The second redistribution layers 242b may also perform various functions depending on a design. For example, the second redistribution layers 242b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second redistribution layers 242b may include via pads, electrical connection structure pads, and the like.

The first connection vias 243a may electrically connect the passive components 225 and the first redistribution layer 242a to each other. The first connection vias 243a may be in physical contact with electrodes of each of the passive components 225. That is, the passive components 225 may be embedded components rather than surface-mounting type components using solder bumps, or the like, and may be in direct contact with the first connection vias 243a. A material of each of the first connection vias 243a may be a conductive material such as copper (Cu), aluminum (Al), silver (Ag), tin (Sn), gold (Au), nickel (Ni), lead (Pb), titanium (Ti), or alloys thereof. Each of the first connection vias 243a may be completely filled with the conductive material, or the conductive material may also be formed along a wall of each of via holes. In addition, each of the first connection vias 243a may have a tapered shape.

The second connection vias 243b may electrically connect the first and second redistribution layers 242a and 242b formed on different layers to each other, and electrically connect the connection pads 221P and 222P of the semiconductor chips 221 and 222 and the second redistribution layer 242b to each other. The second connection vias 243b may be in physical contact with the connection pads 221P and 222P of the semiconductor chips 221 and 222. That is, the semiconductor chips 221 and 222 may be directly connected to the second connection vias 243b of the connection structure 240 in a state in which separate bumps, or the like, do not exist, in a bare die form. A material of each of the second connection vias 243b may be a conductive material such as copper (Cu), aluminum (Al), silver (Ag), tin (Sn), gold (Au), nickel (Ni), lead (Pb), titanium (Ti), or alloys thereof. The second connection via 243b may also be completely filled with a conductive material, or the conductive material may also be formed along a wall of each of via holes. In addition, each of the second connection vias 243b may also have a tapered shape.

Other contents overlap those described above, and a detailed description thereof is thus omitted.

Figure 23:
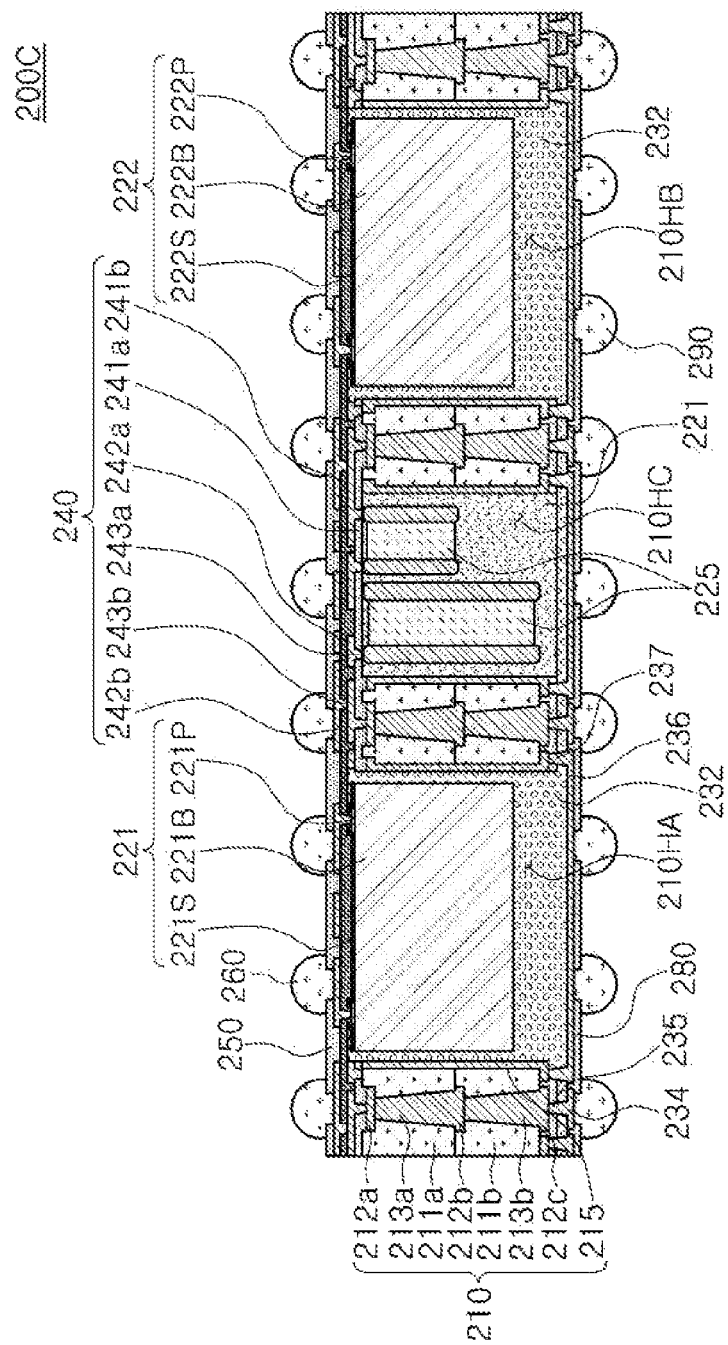
FIG. 23 is a schematic cross-sectional view illustrating a semiconductor package according to another exemplary embodiment used in the antenna module of FIG. 20.

FIG. 23 is a schematic cross-sectional view illustrating a semiconductor package according to another exemplary embodiment used in the antenna module of FIG. 20.

Referring to FIG. 23, in a semiconductor package 200C according to another exemplary embodiment, a frame 210 may include a first insulating layer 211a, a first wiring layer 212a embedded in an upper side of the first insulating layer 211a so that an upper surface thereof is exposed, a second wiring layer 212b disposed on a lower surface of the first insulating layer 211a, a second insulating layer 211b disposed on the lower surface of the first insulating layer 211a and covering the second wiring layer 212b, and a third wiring layer 212c disposed on a lower surface of the second insulating layer 211b. Since the frame 210 may include a large number of wiring layers 212a, 212b, and 212c, a connection structure 240 may further be simplified. Therefore, a decrease in a yield depending on a defect occurring in a process of forming the connection structure 240 may be suppressed. The first and second wiring layers 212a and 212b and the second and third wiring layers 212b and 212c may be electrically connected to each other through first and second connection vias 213a and 213b penetrating through the first and second insulating layers 211a and 211b, respectively.

A connection structure 240 may be disposed on the frame 210, first and second semiconductor chips 221 and 222, and passive components 225 and including first and second redistribution layers 242a and 242b electrically connected to each of first connection pads 221P, second connection pads 222P, and the passive components 225.

When the first wiring layer 212a is embedded in the first insulating layer 211a, a step generated due to a thickness of the first wiring layer 212a may be significantly reduced, and an insulating distance of the connection structure 240 may thus become constant. That is, a difference between a distance from a redistribution layer 242 of the connection structure 240 to an upper surface of the first insulating layer 211a and a distance from the redistribution layer 242 of the connection structure 240 to the connection pads 221P and 222P of semiconductor chips 221 and 222 may be smaller than a thickness of the first wiring layer 212a. Therefore, a high density wiring design of the connection structure 240 may be easily achieved.

A distance between the redistribution layer 242 of the connection structure 240 and the first wiring layer 212a of the frame 210 may be greater than that between the redistribution layer 242 of the connection structure 240 and the connection pads 221P and 222P of the semiconductor chips 221 and 222. The reason is that the first wiring layer 212a may be recessed into the first insulating layer 211a. As described above, when the first wiring layer 212a is recessed into the first insulating layer 211a, such that the upper surface of the first insulating layer 211a and the upper surface of the first wiring layer 212a have a step therebetween, a phenomenon in which a material of an encapsulant 230 bleeds to pollute the first wiring layer 212a may be prevented. The second wiring layer 212b of the frame 210 may be disposed on a level between an active surface and an inactive surface of each of the semiconductor chips 221 and 222.

Thicknesses of the wiring layers 212a, 212b, and 212c of the frame 210 may be greater than those of the redistribution layers 242 of the connection structure 240. Since the frame 210 may have a thickness equal to or greater than that of the semiconductor chips 221 and 222, the wiring layers 212a, 212b, and 212c may be formed to have large sizes depending on a scale of the frame 210. On the other hand, the redistribution layers 242 of the connection structure 240 may be formed to have sizes relatively smaller than those of the wiring layers 212a, 212b, and 212c for thinness.

A material of each of the insulating layers 211a and 211b is not particularly limited. For example, an insulating material may be used as the material of each of the insulating layers 211a and 211b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, Bismaleimide Triazine (BT), or the like. Alternatively, a PID resin may also be used as the insulating material.

The wiring layers 212a, 212b, and 212c may serve to redistribute the connection pads 221P and 222P of the semiconductor chips 221 and 222. A material of each of the wiring layers 212a, 212b, and 212c may be a conductive material such as copper (Cu), aluminum (Al), silver (Ag), tin (Sn), gold (Au), nickel (Ni), lead (Pb), titanium (Ti), or alloys thereof. The wiring layers 212a, 212b, and 212c may perform various functions depending on designs of corresponding layers. For example, the wiring layers 212a, 212b, and 212c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 212a, 212b, and 212c may include signal via pads, ground via pads, and the like. In addition, the wiring layers 212a, 212b, and 212c may include feeding patterns.

The connection vias 213a and 213b may electrically connect the wiring layers 212a, 212b, and 212c formed on different layers to each other, resulting in an electrical path in the frame 210. A material of each of the connection vias 213a and 213b may be a conductive material. Each of the connection vias 213a and 213b may be completely filled with the conductive material, or the conductive material may also be formed along a wall of each of via holes. In addition, each of the connection vias 213a and 213b may have a tapered shape of which a direction is opposite to that of each of redistribution vias 243 of the connection structure 240. When holes for the first connection vias 213a are formed, some of the pads of the first wiring layer 212a may serve as a stopper, and it may thus be advantageous in a process that each of the first connection vias 213a has the tapered shape of which a width of a lower surface is greater than that of an upper surface. In this case, the first connection vias 213a may be integrated with pad patterns of the second wiring layer 212b. In addition, when holes for the second connection vias 213b are formed, some of the pads of the second wiring layer 212b may serve as a stopper, and it may thus be advantageous in a process that each of the second connection vias 213b has the tapered shape of which a width of a lower surface is greater than that of an upper surface. In this case, the second connection vias 213b may be integrated with pad patterns of the third wiring layer 212c.

Other contents overlap those described above, and a detailed description thereof is thus omitted.

Figure 24:
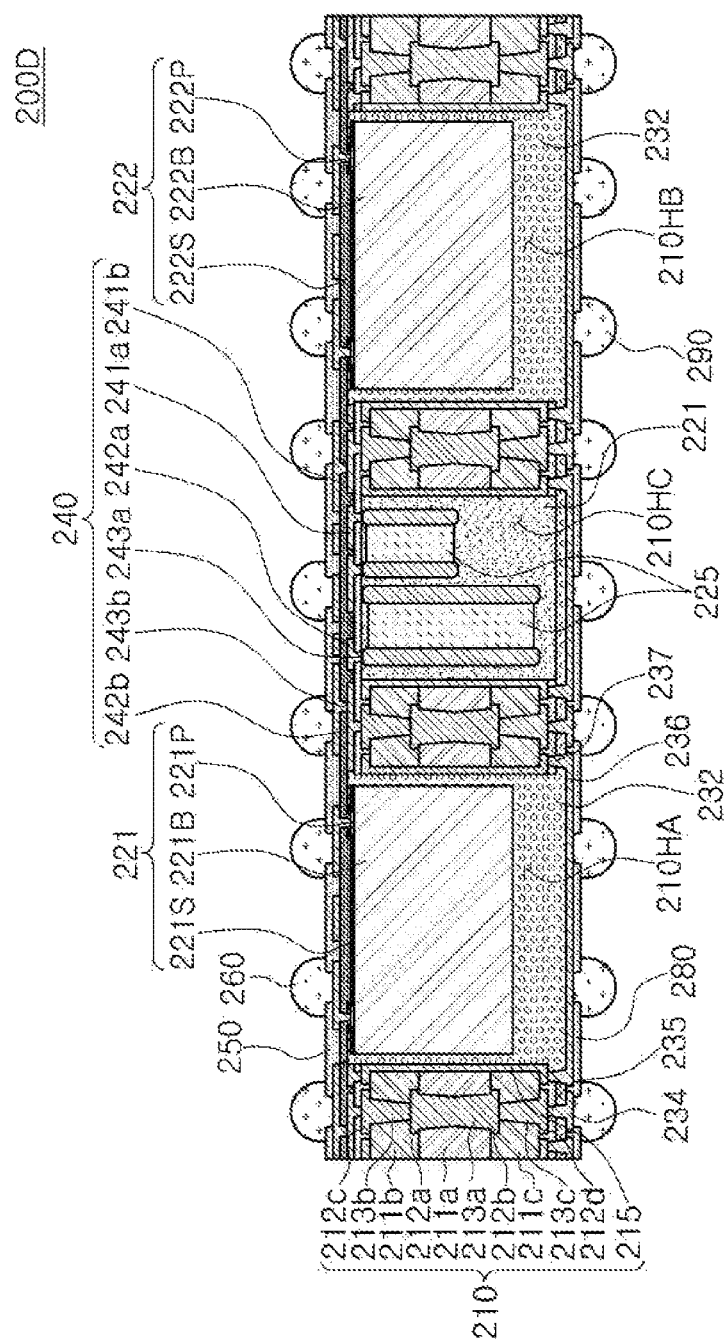
FIG. 24 is a schematic cross-sectional view illustrating a semiconductor package according to another exemplary embodiment used in the antenna module of FIG. 20.

FIG. 24 is a schematic cross-sectional view illustrating a semiconductor package according to another exemplary embodiment used in the antenna module of FIG. 20.

Referring to FIG. 24, in a semiconductor package 200D, a frame 210 may include a first insulating layer 211a, a first wiring layer 212a and a second wiring layer 212b disposed on upper and lower surfaces of the first insulating layer 211a, respectively, a second insulating layer 211b disposed on the upper surface of the first insulating layer 211a and covering the first wiring layer 212a, a third wiring layer 212c disposed on an upper surface of the second insulating layer 211b, a third insulating layer 211c disposed on the lower surface of the first insulating layer 211a and covering the second wiring layer 212b, and a fourth wiring layer 212d disposed on a lower surface of the third insulating layer 211c. Since the frame 210 may include a large number of wiring layers 212a, 212b, 212c, and 212d, a connection structure 240 may further be simplified. Therefore, a decrease in a yield depending on a defect occurring in a process of forming the connection structure 240 may be suppressed. Meanwhile, the first to fourth wiring layers 212a, 212b, 212c, and 212d may be electrically connected to each other through first to third connection vias 213a, 213b, and 213c each penetrating through the first to third insulating layers 211a, 211b, and 211c.

A material of each of the insulating layers 211a, 211b, and 211c is not particularly limited. For example, an insulating material may be used as the material of each of the insulating layers 211a, 211b, and 211c. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The first insulating layer 211a may have a thickness greater than those of the second insulating layer 211b and the third insulating layer 211c. The first insulating layer 211a may be basically relatively thick in order to maintain rigidity, and the second insulating layer 211b and the third insulating layer 211c may be introduced in order to form a larger number of wiring layers 212c and 212d. The first insulating layer 211a may include an insulating material different from those of the second insulating layer 211b and the third insulating layer 211c. For example, the first insulating layer 211a may be, for example, prepreg including a core material, a filler, and an insulating resin, and the second insulating layer 211b and the third insulating layer 211c may be an ABF or a PID film including a filler and an insulating resin. However, the materials of the first insulating layer 211a and the second and third insulating layers 211b and 211c are not limited thereto.

The wiring layers 212a, 212b, 212c, and 212d may serve to redistribute connection pads 221P and 222P of semiconductor chips 221 and 222. A material of each of the wiring layers 212a, 212b, 212c, and 212d may be a conductive material such as copper (Cu), aluminum (Al), silver (Ag), tin (Sn), gold (Au), nickel (Ni), lead (Pb), titanium (Ti), or alloys thereof. The wiring layers 212a, 212b, 212c, and 212d may perform various functions depending on designs of corresponding layers. For example, the wiring layers 212a, 212b, 212c, and 212d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 212a, 212b, 212c, and 212d may include signal via pads, ground via pads, and the like. In addition, the wiring layers 212a, 212b, 212c, and 212d may include feeding patterns.

The first wiring layer 212a and the second wiring layer 212b may be disposed on a level between an active surface and an inactive surface of each of the semiconductor chips 221 and 222. Thicknesses of the wiring layers 212a, 212b, 212c, and 212d of the frame 210 may be greater than those of redistribution layers 242 of the connection structure 240.

The connection vias 213a, 213b, and 213c may electrically connect the wiring layers 212a, 212b, 212c, and 212d formed on different layers to each other, resulting in an electrical path in the frame 210. A material of each of the connection vias 213a, 213b, and 213c may be a conductive material. Each of the connection vias 213a, 213b, and 213c may be completely filled with the conductive material, or the conductive material may also be formed along a wall of each of via holes. The first connection vias 213a may have an hourglass shape or a cylindrical shape, and the second and third connection vias 213b and 213c may have tapered shapes of which directions are opposite to each other. The first connection vias 213a penetrating through the first insulating layer 211a may have a diameter greater than those of the second and third connection vias 213*b* and 213*c* each penetrating through the second and third insulating layers 211*b* and 211*c*.

Other contents overlap those described above, and a detailed description thereof is thus omitted.

As set forth above, according to an exemplary embodiment in the present disclosure, an antenna substrate capable of allowing a degree of freedom to be secured when an antenna module is mounted in a set by allowing an overall thickness of the antenna module to be reduced in a case in which the antenna substrate is used in the antenna module, and an antenna module including the same may be provided.

While exemplary embodiments have been shown and described above, it will be apparent to those skilled in the art that modifications and variations could be made without departing from the scope of the present invention as defined by the appended claims.

What is claimed is:

1. An antenna substrate comprising:
a first substrate including an antenna pattern, and having an upper surface, a lower surface opposing the upper surface in a first direction, and a side surface connecting the upper and lower surfaces to each other;
a second substrate having a first planar surface, a second planar surface opposing the first planar surface and a side edge surface disposed between the first and second planar surfaces, wherein an area of each of the first and second planar surfaces is smaller than an area of each of the upper and lower surfaces of the first substrate; and
a flexible substrate connecting the side surface of the first substrate and the side edge surface of the second substrate to each other, such that the second substrate is rotatable to allow the first planar surface of the second substrate to contact the side surface of the first substrate via an adhesive layer.

2. The antenna substrate of claim 1,
wherein a length, extending away from the flexible substrate, of the first planar surface of the second substrate is less than or equal to a length, defined in the first direction, of the side surface of the first substrate.

3. An antenna module comprising:
an antenna substrate including:
a first substrate including an antenna pattern, and having an upper surface, a lower surface opposing the upper surface in a first direction, and a side surface connecting the upper and lower surfaces to each other,
a second substrate having a first planar surface, a second planar surface opposing the first planar surface and a side edge surface disposed between the first and second planar surfaces, wherein an area of each of the first and second planar surfaces is smaller than an area of each of the upper and lower surfaces of the first substrate; and
a flexible substrate connecting the side surface of the first substrate and the side edge surface of the second substrate to each other, and bent to allow the first planar surface of the second substrate to contact and face the side surface of the first substrate in a final position via an adhesive layer; and
an electronic component disposed on the second planar surface of the second substrate.

4. The antenna module of claim 3, wherein the electronic component is surface-mounted on the second planar surface of the second substrate.

5. The antenna module of claim 4, wherein a mounting surface of the electronic component faces the side surface of the first substrate.

6. The antenna module of claim 3, further comprising:
at least one semiconductor chip surface-mounted on the lower surface of the first substrate;
at least one passive component surface-mounted on the lower surface of the first substrate;
an encapsulant disposed on the lower surface of the first substrate and covering at least a part of the at least one semiconductor chip and the at least one passive component; and
a metal layer covering an outer surface of the encapsulant.

7. The antenna module of claim 3, further comprising:
at least one semiconductor chip surface-mounted on the lower surface of the first substrate, perpendicular to the side surface of the first substrate;
at least one passive component surface-mounted on the lower surface of the first substrate; and
a shield can disposed on the lower surface of the first substrate and surrounding the at least one semiconductor chip and at the least one passive component.

8. The antenna module of claim 3, further comprising a semiconductor package disposed below the antenna substrate and including at least one semiconductor chip,
wherein the electronic component has a thickness greater than that of the at least one semiconductor chip.

9. The antenna module of claim 8, wherein the semiconductor package includes a radio frequency integrated circuit (RFIC) and a power management integrated circuit (PMIC) as the at least one semiconductor chip, and
the semiconductor package further includes a multilayer ceramic capacitor (MLCC), and
the electronic component is a power inductor (PI).

10. The antenna module of claim 8, wherein the semiconductor package includes:
a frame having a first through-hole;
a first semiconductor chip disposed in the first through-hole, and having a first active surface having first connection pads disposed thereon and a first inactive surface opposing the first active surface;
an encapsulant covering at least a part of each of the frame and the first inactive surface of the first semiconductor chip, and filling at least a part of the first through-hole; and
a connection structure disposed on the frame and the first active surface of the first semiconductor chip, and including redistribution layers electrically connected to the first connection pads.

11. The antenna module of claim 10, wherein the frame further comprises a second through-hole spaced apart from the first through-hole and a third through-hole spaced apart from the first and second through-holes,
a second semiconductor chip is disposed in the second through-hole, the second semiconductor chip having a second active surface having second connection pads disposed thereon and a second inactive surface opposing the second active surface, and
a passive component is disposed in the third through-hole.

12. The antenna module of claim 11, wherein the frame includes a metal layer disposed on walls of the first, second, and third through-holes and extending from a top surface to a lower surface of the frame, and
the semiconductor package further includes a backside metal layer disposed on a lower surface of the encapsulant and backside metal vias penetrating through the encapsulant and connecting the backside metal layer to the metal layer of the frame.

13. The antenna module of claim 10, wherein the frame includes an insulating layer, a first wiring layer disposed on an upper surface of the insulating layer, a second wiring layer disposed on a lower surface of the insulating layer, and connection vias penetrating through the insulating layer and electrically connecting the first and second wiring layers to each other, and the semiconductor package further includes a backside wiring layer disposed on a lower surface of the encapsulant and backside connection vias penetrating through the encapsulant and connecting the backside wiring layer to the second wiring layer of the frame.

14. The antenna module of claim 10, wherein the frame includes a first insulating layer, a first wiring layer disposed on an upper surface of the first insulating layer, a second wiring layer disposed on a lower surface of the first insulating layer, a second insulating layer disposed on the upper surface of the first insulating layer and covering the first wiring layer, a third wiring layer disposed on an upper surface of the second insulating layer, a third insulating layer disposed on the lower surface of the first insulating layer and covering the second wiring layer, a fourth wiring layer disposed on a lower surface of the third insulating layer, first connection vias penetrating through the first insulating layer and electrically connecting the first and second wiring layers to each other, second connection vias penetrating through the second insulating layer and electrically connecting the first and third wiring layers to each other, and third connection vias penetrating through the third insulating layer and electrically connecting the second and fourth wiring layers to each other.

15. The antenna module of claim 10, wherein the frame includes a first insulating layer, a first wiring layer embedded in an upper side of the first insulating layer so that an upper surface of the first wiring layer is exposed, a second wiring layer disposed on a lower surface of the first insulating layer, a second insulating layer disposed on the lower surface of the first insulating layer and covering the second wiring layer, a third wiring layer disposed on a lower surface of the second insulating layer, first connection vias penetrating through the first insulating layer and electrically connecting the first and second wiring layers to each other, and second connection vias penetrating through the second insulating layer and electrically connecting the second and third wiring layers to each other.

16. The antenna module of claim 15, wherein the first wiring layer is disposed on a surface recessed from an upper surface of the first insulating layer, such that the upper surface of the first insulating layer and the upper surface of the first wiring layer have a step therebetween.

17. The antenna module of claim 3, wherein the first planar surface of the second substrate is attached to the side surface of the first substrate by an adhesive member.

18. The antenna substrate of claim 3, wherein a length, extending away from the flexible substrate, of the first planar surface of the second substrate is less than or equal to a length, defined in the first direction, of the side surface of the first substrate.

19. An antenna substrate comprising:

a first substrate including an antenna pattern, and having an upper surface, a lower surface opposing the upper surface in a first direction, and a side surface connecting the upper and lower surfaces to each other;

a second substrate having a first planar surface, a second planar surface opposing the first planar surface and a side edge surface disposed between the first and second planar surfaces, wherein an area of each of the first and second planar surfaces is smaller than an area of each of the upper and lower surfaces of the first substrate; and a flexible substrate connecting the side surface of the first substrate and the side edge surface of the second substrate to each other, such that the second substrate is rotatable to allow the first planar surface of the second substrate to contact the side surface of the first substrate via an adhesive layer, wherein a length, extending away from the flexible substrate, of the first planar surface of the second substrate is less than or equal to a length, defined in the first direction, of the side surface of the first substrate.

\* \* \* \* \*